(12) United States Patent
Matsuda et al.

(10) Patent No.: US 7,852,890 B2
(45) Date of Patent: Dec. 14, 2010

(54) SEMICONDUCTOR LASER AND MANUFACTURING METHOD THEREOF

(75) Inventors: Manabu Matsuda, Kawasaki (JP); Tsuyoshi Yamamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 238 days.

(21) Appl. No.: 11/113,054

(22) Filed: Apr. 25, 2005

(65) Prior Publication Data

US 2006/0120421 A1 Jun. 8, 2006

(30) Foreign Application Priority Data

Dec. 2, 2004 (JP) ............................. 2004-349704

(51) Int. Cl.
*H01S 3/04* (2006.01)
*H01S 5/00* (2006.01)

(52) U.S. Cl. .................................. 372/43.01

(58) Field of Classification Search ............... 372/43.01
See application file for complete search history.

(56) References Cited

U.S. PATENT DOCUMENTS

| | | | | |
|---|---|---|---|---|
| 4,656,636 | A * | 4/1987 | Amann et al. | 372/50.11 |
| 4,815,087 | A * | 3/1989 | Hayashi | 372/45.01 |
| 4,977,568 | A * | 12/1990 | Yamamoto et al. | 372/46.01 |
| 5,438,637 | A * | 8/1995 | Nilsson et al. | 385/10 |
| 5,717,710 | A * | 2/1998 | Miyazaki et al. | 372/50.11 |
| 6,084,901 | A | 7/2000 | Suzuki | |
| 6,292,503 | B1 | 9/2001 | Watanabe et al. | 372/45 |
| 6,323,507 | B1 * | 11/2001 | Yokoyama et al. | 257/79 |
| 2002/0191666 | A1 * | 12/2002 | Stoltz et al. | 372/102 |

FOREIGN PATENT DOCUMENTS

| | | |
|---|---|---|
| JP | 6-296063 | 10/1994 |
| JP | 9-191148 | 7/1997 |
| JP | 9-191153 | 7/1997 |
| JP | 10-178232 | 6/1998 |
| JP | 11-54829 | 2/1999 |
| JP | 11-145557 | 5/1999 |
| JP | 11-274637 | 10/1999 |
| JP | 2003-152273 | 5/2003 |

OTHER PUBLICATIONS

Japanese Office Action dated Jun. 30, 2009, with English Translation.

(Continued)

*Primary Examiner*—Minsun Harvey
*Assistant Examiner*—Patrick Stafford
(74) *Attorney, Agent, or Firm*—Kratz, Quintos & Hanson, LLP

(57) ABSTRACT

In a semiconductor laser, in order to realize a desired oscillation wavelength efficiently by adjusting the oscillation wavelength of the laser with sufficient accuracy even when the oscillation wavelength of a manufactured laser deviates from a design value, for example, due to the manufacturing errors and the like in the manufacturing of the laser, there is provided a semiconductor laser comprising a semiconductor substrate, a semiconductor stacking body including a waveguide formed on the semiconductor substrate, and a diffraction grating, wherein the diffraction grating is formed along the waveguide so as to appear in the surface of the semiconductor stacking body.

13 Claims, 12 Drawing Sheets

OTHER PUBLICATIONS

Machine English Translation of JP 11-145557 (document AF), May 28, 1999.

Machine English Translation of JP 11-54829 (document AG), Feb. 26, 1999.

Machine English Translation of JP 9-191148 (document AI), Jul. 22, 1997.

Machine English Translation of JP 9-191153 (document AJ), Jul. 22, 1999.

* cited by examiner

US 7,852,890 B2

SEMICONDUCTOR LASER AND MANUFACTURING METHOD THEREOF

BACKGROUND OF THE INVENTION

Cross Reference to Related Applications

This application is based on and hereby claims priority to Japanese Patent Application No. 2004-349704 filed on 2 Dec. 2004 in Japan, the contents of which are hereby incorporated by reference

BACKGROUND OF THE INVENTION (1) Field of the Invention

The present invention relates to a semiconductor laser and a manufacturing method thereof, and relates to a DFB (Distributed Feed Back type) laser or a DBR (Distributed Bragg Reflector type) laser which operates in a single wavelength, for example, as the light source for a DWDM (Dense Wavelength Division Multiplexing) optical-fiber transmission system.

(2) Description of Related Art

Recently, as the demand for the Internet has increased explosively, an ultra-higher speed and a larger capacity in an optical-communication/optical-transmission system has been actively pursued.

In particular, the larger capacity has been realized thanks to the significant development of the wavelength multiplexing optical-transmission technology. What supports this technology are a single wavelength laser or a tunable laser for stably providing light with a number of different wavelengths, and a fiber amplifier to amplify and relay collectively a large number of optical signals transmitting over an optical fiber. For example, the DFB laser which operates in a single wavelength is used as the light source of the transmitting side.

In the DWDM optical-transmission system, the channel is typically set at a frequency interval of 50 GHz or 100 GHz. Namely, converting this into wavelength, the channel is set at a wavelength interval of approximately 0.4 nm or approximately 0.8 nm. The deviation of the absolute wavelength of these channels needs to be set to ±0.05 nm or less. As the light source of such DWDM optical-transmission system, the DFB laser which oscillates stably in a single wavelength is mainly used.

Here, FIG. 21 is a view showing a typical structure of a DFB laser, and FIG. 22 is a cross sectional plan view along the alternate long and short dash line shown by A-A' and the alternate long and short dash line shown by B-B' of FIG. 21.

As shown in FIG. 21, the DFB laser is configured as including: an n-type doped InP substrate 1, an undoped GaInAsP guide layer 2 (with a thickness of 150 nm, and a composition wavelength of 1150 nm), a quantum well active layer 3 in which an undoped GaInAsP quantum well layer (with a thickness of 5.1 nm) and an undoped GaInAsP barrier layer (with a thickness of 10 nm, a composition wavelength of 1300 nm) are stacked repeatedly 7 times, a p-type doped InP electric-current constriction layer 4, an n-type doped InP electric-current constriction layer 5, a p-type doped InP cladding layer 6, a p-type doped GaInAs contact layer 7, a p-side electrode 8, an n-side electrode 9, and a diffraction grating 10 with a period of 242 nm, and a depth of 50 nm.

The oscillation wavelength $\lambda_{DFB}$ of this DFB laser is expressed by the following equation, using a value $n_{eq}$ inherent to a waveguide and referred to as the equivalent refractive index of this laser, and the period $\Lambda$ of the diffraction grating formed along the waveguide (designated by the numeral 10 in FIG. 22).

$$\lambda_{DFB} = 2 \times n_{eq} \times \Lambda$$

In the conventional DFB laser configured this way, in the step of designing the structure of the laser, the period $\Lambda$ of the diffraction grating is determined in advance in accordance with the oscillation wavelength $\lambda_{DFB}$, and at the time of manufacturing the laser the diffraction grating is formed inside the semiconductor crystal (here, between the guide layer (waveguide) 2 extending in parallel with the active layer 3 and the n-type doped InP substrate 1). Namely, at the time of manufacturing the laser, the diffraction grating is formed in the course of the steps of stacking the semiconductor layers.

In addition, the semiconductor lasers having the diffraction grating are disclosed in Japanese Patent Laid-Open (Kokai) Hei 6-296063, Japanese Patent Laid-Open (Kokai) Hei 10-178232, and Japanese Patent Laid-Open (Kokai) 2003-152273, for example.

SUMMARY OF THE INVENTION

Incidentally, there are cases where the oscillation wavelength of the laser (element) after completion deviates from the design value due to the manufacturing errors at the time of manufacturing the laser (for example, when forming the active layer 3 in a mesa shape, the width thereof may deviate from the design value due to the manufacturing errors).

However, as described above, because in the conventional DFB laser (or DBR laser) the diffraction grating is formed inside the semiconductor crystal, the oscillation wavelength of the laser cannot be adjusted after completion.

Moreover, the evaluation (the judgment of good/defective) of the oscillation wavelength of the laser is usually made after actually having manufactured the laser. In this case, it will take a long time (the time lag is large) after having decided the period of the diffraction grating based on the design till the evaluation of the oscillation wavelength of the actually manufactured laser. For this reason, if judged as defective as a result of the evaluation of the oscillation wavelength of the laser, time consumed by that time will be wasted, which is not preferable.

Moreover, in the case where the DWDM optical-transmission system is configured at a wavelength interval of 0.4 nm, 88 channels can be set in a C-band. However, in reality, there will be not necessarily demands equally for all the respective channels. Under such situation, it is not preferable to manufacture the lasers having the oscillation wavelengths corresponding to all the channels in advance, and to have the inventory of the lasers equally for all the channels, because there will have a lot of inventories of the lasers with few purchase orders to be placed. Moreover, a large quantity of outside-specification products (nonstandard products) would have been manufactured.

The present invention has been made in view of such a problem, and is intended to provide a semiconductor laser and a manufacturing method thereof, wherein even when the oscillation wavelength of the manufactured laser may deviate from the design value, for example, due to the manufacturing errors or the like at the time of manufacturing the laser, the desired oscillation wavelength can be realized efficiently by adjusting the oscillation wavelength of the laser with sufficient accuracy.

For this reason, a semiconductor laser of the present invention includes: a semiconductor substrate; a semiconductor stacking body including a waveguide formed on the semiconductor substrate; and a diffraction grating, wherein the diffraction grating is formed along the waveguide so as to appear in the surface of the semiconductor stacking body.

Moreover, a manufacturing method of a semiconductor laser includes the steps of: forming a semiconductor stacking body which includes a waveguide on a semiconductor substrate; and forming a diffraction grating along the waveguide so as to appear in the surface of the semiconductor stacking body.

Consequently, according to the present invention, after having formed the semiconductor stacking body, the diffraction grating is formed in the upper region of the active layer so as to appear in the surface of the semiconductor stacking body. Therefore, for example, even when the manufacturing errors or the like may occur at the time of manufacturing the laser, the period of the diffraction grating can be adjusted with sufficient accuracy (namely, fine tuning of the period of the diffraction grating can be made), and the oscillation wavelength of the laser can be adjusted with sufficient accuracy. Thus, there is an advantage that the desired oscillation wavelength can be realized efficiently.

DESCRIPTION OF THE PREFERRED EMBODIMENTS

Hereinafter, with reference to the drawings, a semiconductor laser and a manufacturing method thereof concerning embodiments of the present invention will be described.

First Embodiment

First, a semiconductor laser and a manufacturing method thereof concerning a first embodiment of the present invention will be described with reference to FIG. 1 to FIG. 4.

Figure 1:
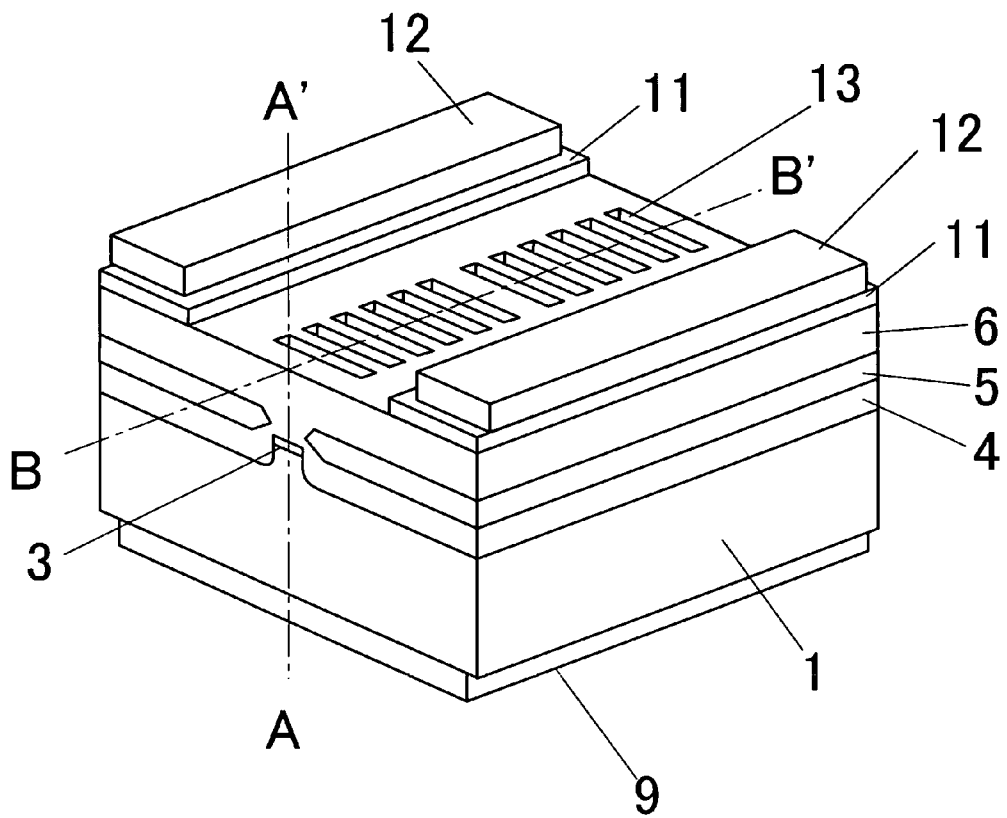
FIG. 1 is an illustrative perspective view showing a structure of a semiconductor laser concerning a first embodiment of the present invention.

The semiconductor laser concerning this embodiment is a semiconductor laser (a buried semiconductor laser; a DFB laser) having an buried hetero-structure (a BH structure), and, as shown in FIG. 1, is configured including: an n-type doped InP substrate 1 (a semiconductor substrate, a cladding layer); a quantum well active layer (a waveguide, a core layer, a waveguide core layer) 3 in which an undoped GaInAsP layer (a quantum well layer; with a thickness of 5.1 nm) and an undoped GaInAsP (a barrier layer; with a thickness of 10 nm, a composition wavelength of 1300 nm) are stacked repeatedly 7 times; a p-type doped InP layer (an electric-current constriction (blocking) layer) 4; an n-type doped InP layer (an electric-current constriction (blocking) layer) 5; a p-type doped InP layer (a cladding layer) 6; an n-side electrode 9; a p-type doped GaInAs layer (a contact layer) 11; a p-side electrode 12; and a diffraction grating 13.

Here, as shown in FIG. 1, the quantum well active layer 3, the p-type doped InP electric-current constriction layer 4, the n-type doped InP electric-current constriction layer 5, the p-type doped InP cladding layer 6 formed on the quantum well active layer 3, and the p-type doped GaInAs contact layer 11 being the top layer formed on the p-type doped InP cladding layer 6 are formed by stacking on the n-type doped InP substrate 1. For this reason, these are collectively referred to as the semiconductor stacking body.

Moreover, in this case, a mesa-structure is formed so as to extend in the optical axis direction of the laser, and in both sides thereof the n-type doped InP substrate 1, the p-type doped InP electric-current constriction layer 4, the n-type doped InP electric-current constriction layer 5, and the p-type doped InP cladding layer 6 are stacked to constitute an electric-current constriction (blocking) structure by these layers. Namely, here, the electric-current constriction structure is a pnpn thyristor structure.

Figure 2:
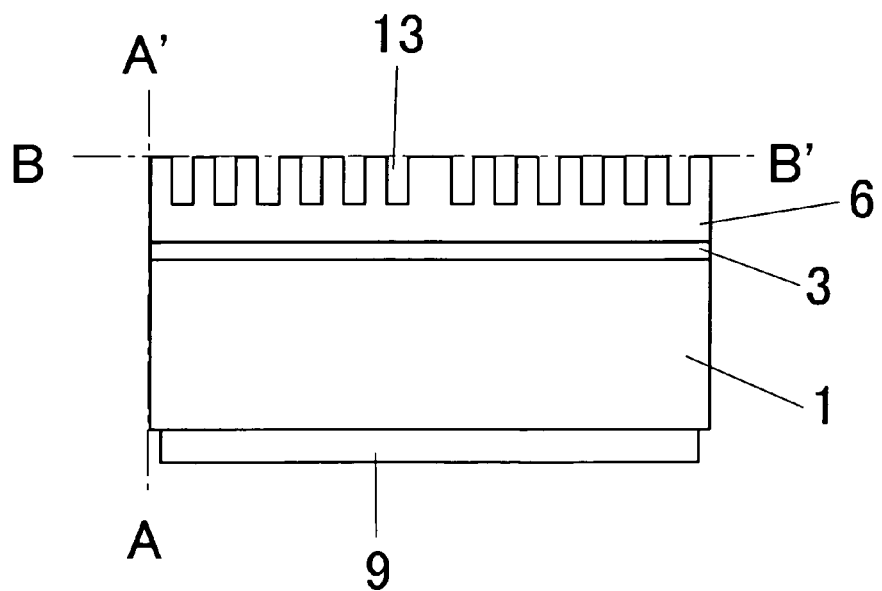
FIG. 2 is an illustrative cross sectional view showing the structure of the semiconductor laser concerning the first embodiment of the present invention, and is a cross sectional view along the alternate long and short dash line shown by A-A', and the alternate long and short dash line shown by B-B of FIG. 1.

In addition, the diffraction grating 13 is formed in the p-type doped InP cladding layer 6 in the upper region of the quantum well active layer 3, as shown in FIG. 2. Namely, as shown in FIG. 2, the diffraction grating 13 is formed in parallel along the quantum well active layer 3 in the region having a predetermined width right above the quantum well active layer 3 so as to extend from the surface (namely, the surface at the crystal growth side of the semiconductor stacking body; the surface of the semiconductor crystal) of the p-type doped InP cladding layer 6 formed on the n-type doped InP substrate 1 by a crystal growth (for example, an epitaxial growth), to the inside thereof.

Incidentally, while the diffraction grating 13 is formed in the p-type doped InP cladding layer 6 in this case, the present invention is not limited to this. For example, the diffraction grating 13 may be formed so as to extend from the surface of the p-type doped InP cladding layer 6 to the p-type doped InP electric-current constriction layer 4 or to the n-type doped InP electric-current constriction layer 5.

Moreover, in the case where the diffraction grating 13 is formed so as to appear in the surface of the p-type doped InP cladding layer 6, the diffraction grating 13 is provided in the position further away from the quantum well active layer 3 than, for example, in the case where the diffraction grating 13 is formed in the guide layer adjacent to the active layer. Therefore, it is necessary to make the depth of the groove of the diffraction grating 13 deeper.

Thus, in this embodiment, because the diffraction grating 13 is formed so as to appear in the surface of the p-type doped InP cladding layer 6, the p-type doped GaInAs contact layer 11 is formed in the region where the diffraction grating 13 is not formed in the surface of the p-type doped InP cladding layer 6, as shown in FIG. 1. Namely, the p-type doped GaInAs contact layer 11 is formed in parallel along the region where the diffraction grating 13 is formed (namely, the region having a predetermined width right above the quantum well active layer 3) in the opposite sides of the region in which the diffraction grating 13 is formed. Then, on this p-type doped GaInAs contact layer 11 the p-side electrode 12 is provided.

Incidentally, between the p-type doped InP cladding layer 6 and the p-type doped GaInAs contact layers 11, one layer or a plurality of layers of the p-type doped GaInAsP may be provided. Thereby, the resistance of the device can be reduced.

Then, a manufacturing method of the semiconductor laser concerning this embodiment will be described.

First, the semiconductor stacking body comprising the quantum well active layer 3, the p-type doped InP electric-current constriction layer 4, the n-type doped InP electric-current constriction layer 5, the p-type doped InP cladding layer 6, and the p-type doped GaInAs contact layer 11 is manufactured by a manufacturing method of the semiconductor laser having a general buried hetero-structure (BH structure) of Fabry-Perot type (process of manufacturing the semiconductor stacking body, process of manufacturing semiconductor crystals).

Then, the p-type doped GaInAs contact layer 11 located in the top layer of the semiconductor stacking body is removed across a predetermined width (for example, a width of approximately 5 μm to approximately 50 μm) in the upper region of the quantum well active layer 3 using the general photolithography technology. Thereby, as shown in FIG. 3, two belt-like p-type doped GaInAs contact layers 11 are formed in parallel along the quantum well active layer 3 (in the optical axis direction of the laser) in the opposite sides of the region having a predetermined width (for example, a width of approximately 5 μm to approximately 50 μm) in the direction perpendicular to the optical axis of the laser.

Figure 3:
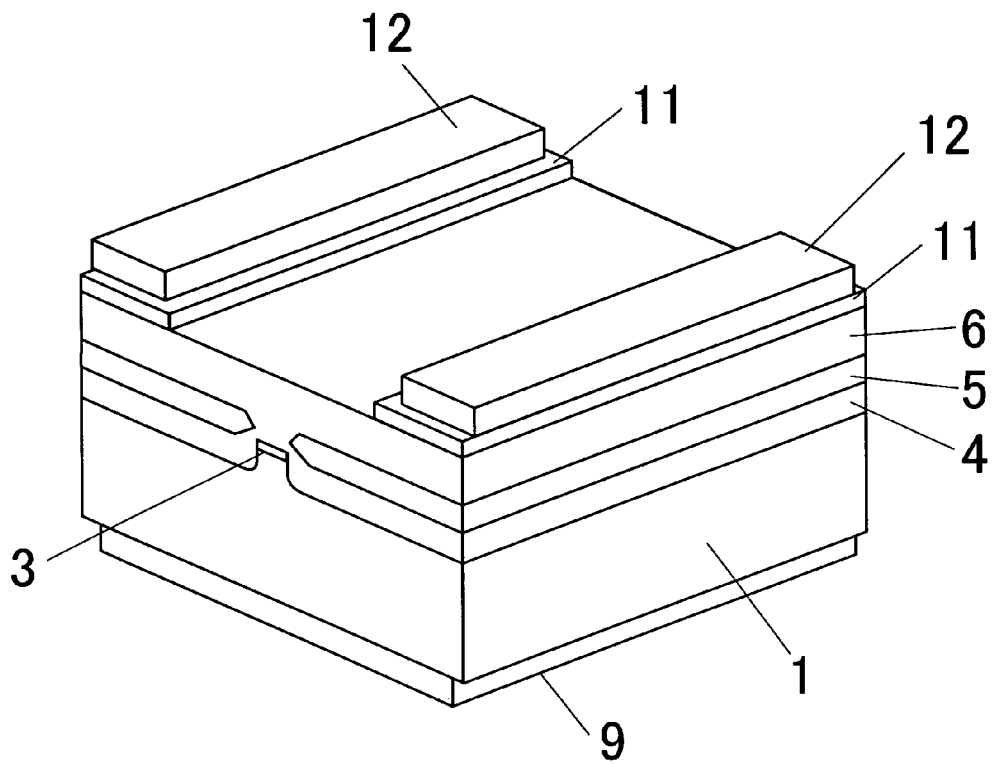
FIG. 3 is an illustrative perspective view showing a structure of a half-finished product (a semimanufactured product) of the semiconductor laser concerning the first embodiment of the present invention.

Then, as shown in FIG. 3, only on the two p-type doped GaInAs contact layers 11 formed this way, two belt-like p-side electrodes 12 are formed in parallel along the quantum well active layer 3 (in the optical axis direction of the laser), respectively.

In this way, as shown in FIG. 3, firstly, a half-finished product in which the diffraction grating 13 is not formed is manufactured (process of manufacturing the half-finished product).

Note that, while here the half-finished product is configured as including the p-side electrode 12, the present invention is not limited to this. For example, the half-finished product may be configured as not including the p-side electrode 12. In this case, the half-finished product will be configured as a semiconductor stacking body (a semiconductor crystal) consisting of only the semiconductor layers.

Figure 4:
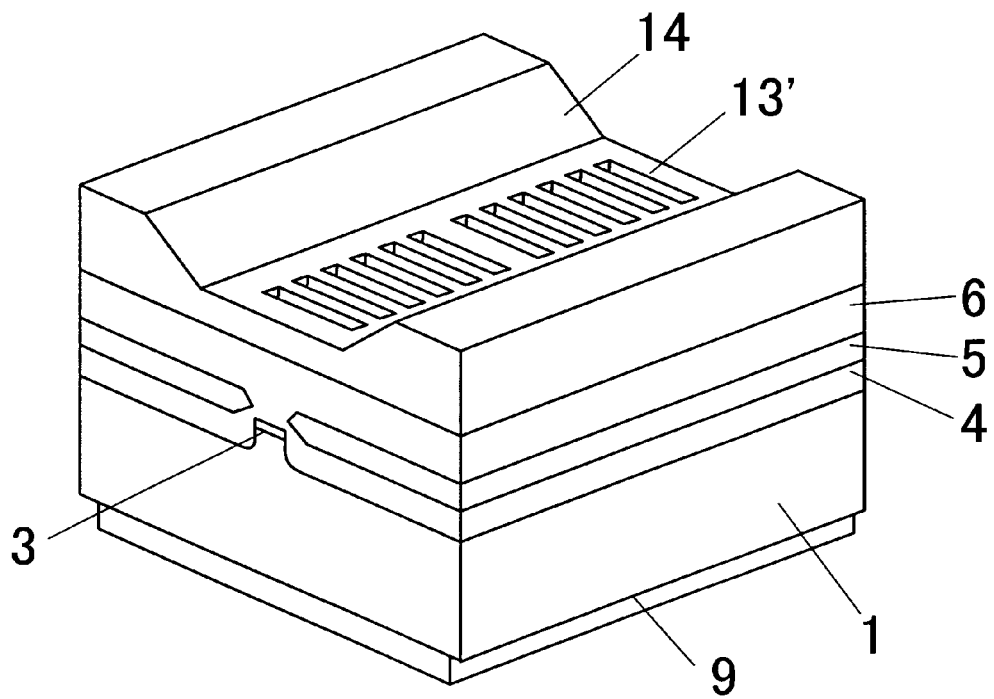
FIG. 4 is an illustrative perspective view for explaining a process of forming a diffraction grating in a manufacturing method of the semiconductor laser concerning the first embodiment of the present invention.

Then, a diffraction grating pattern 13' is formed by applying photoresist 14 to one half-finished product (device) manufactured as described above and by an exposure (for example, an interference exposure, an electron beam (EB) exposure or the like), as shown in FIG. 4.

Next, after having tranferred the diffraction grating pattern 13' onto the p-type doped InP cladding layer 6 by dry etching, the resist 14 is removed (peeled off).

In this way, a semiconductor laser for evaluation (device) in which the diffraction grating 13 is formed is manufactured (refer to FIG. 1). Namely, the semiconductor laser for evaluation is manufactured by forming the diffraction grating 13 along the quantum well active layer 3 in the region having a predetermined width right above the quantum well active layer 3 so as to extend from the surface (namely, the surface at the crystal growth side of the semiconductor stacking body; the surface of the semiconductor crystal) of the p-type doped InP cladding layer 6 formed as described above to the inside thereof (process of manufacturing the semiconductor laser for evaluation).

Incidentally, the semiconductor laser for evaluation is manufactured by determining the period of the diffraction grating 13 using a typical value of the equivalent refractive index with which the desired oscillation wavelength can be realized, and by forming the diffraction grating 13 having this determined period in the half-finished product.

Then, the oscillation wavelength of this semiconductor laser for evaluation is measured, and the equivalent refractive index is identified based on this measured result. Namely, from the measured oscillation wavelength and the period of the diffraction grating determined as described above, the value of the equivalent refractive index is calculated by the following equation. Incidentally, the oscillation wavelength is denoted by $\lambda_{DFB}$, the value of the equivalent refractive index by $n_{eq}$, and the period of the diffraction grating by $\Lambda$.

$$\lambda_{DFB}=2\times n_{eq}\times \Lambda$$

In addition, while here the equivalent refractive index is identified by forming the diffraction grating 13 in the half-finished product and by manufacturing the semiconductor laser for evaluation and then by measuring the oscillation wavelength thereof, however, the present invention is not limited to this. For example, by examining the width of the active-layer by the inspection of the cross-sectional shape of a part of the wafer, the equivalent refractive index thereof may be identified by calculation.

Then, the period of the diffraction grating 13 with which the desired oscillation wavelength can be realized is determined using the value of the equivalent refractive index identified this way. Namely, from the value of the equivalent refractive index identified as described above and the desired oscillation wavelength, the period of the diffraction grating 13 is determined in accordance with the above described equation (process of determining the period of the diffraction grating).

Then, with the same process as the manufacturing process (refer to FIG. 4) of the semiconductor laser for evaluation as described above, the diffraction grating 13 having the determined period is formed in the half-finished product manufactured as described above. Namely, the diffraction grating 13 having the determined period is formed along the quantum well active layer 3 in the region having a predetermined width right above the quantum well active layer 3 so as to extend from the surface (namely, the surface at the crystal growth side of the semiconductor stacking body; the surface of the semiconductor crystal) of the p-type doped InP cladding layer 6 of the half-finished product to the inside thereof. Thereby, the semiconductor laser having the desired oscillation wavelength is manufactured (process of manufacturing the semiconductor laser, process of manufacturing the finished product).

Thus, in this embodiment, after having formed on the n-type doped InP substrate 1 the semiconductor stacking body which includes the quantum well active layer 3, the diffraction grating 13 is formed in the upper region of the quantum well active layer 3 so as to appear in the surface of the semiconductor stacking body.

Accordingly, in the semiconductor laser and the manufacturing method thereof concerning this embodiment, because in the final process of the processes of manufacturing the semiconductor laser the diffraction grating 13 is formed, namely, because after having formed the semiconductor stacking body the diffraction grating is formed in the upper region of the active layer so as to appear in the surface of the semiconductor stacking body, the period of the diffraction grating can be adjusted with sufficient accuracy and the oscillation wavelength of the laser can be adjusted with sufficient accuracy, for example, even when the manufacturing errors or the like may occur at the time of manufacturing lasers. Thus, there is an advantage that the desired oscillation wavelength can be realized efficiently.

Moreover, as described above, in this embodiment, the semiconductor laser for evaluation is manufactured from the half-finished product of the semiconductor laser, and the period of the diffraction grating 13 with which the desired oscillation wavelength can be realized is determined using the value of the equivalent refractive index identified by measuring the oscillation wavelength of the semiconductor laser for evaluation, based on this, the diffraction grating 13 is formed in the half-finished product. Therefore, that useless products are manufactured caused by, for example, that the oscillation wavelength of the manufactured semiconductor laser was deviated from the design value at the time of manufacturing the laser by that manufacturing errors and the like occurred, can be prevented, and there is also an advantage that the yield will be thus improved.

Furthermore, because the semiconductor laser for evaluation can be manufactured just by manufacturing the half-finished product in advance and then forming the diffraction grating 13 in this half-finished product and thus the measurement and evaluation of the oscillation wavelength can be made promptly, there is also an advantage that the period of the diffraction grating 13 can be determined with sufficient accuracy by finely adjusting the period of the diffraction grating 13 without spending wasteful time, and thereby the desired oscillation wavelength can be realized efficiently.

Moreover, according to this embodiment, the half-finished product in which the diffraction grating 13 is not formed is manufactured in advance, and then the diffraction grating having the period with which the desired oscillation wavelength is realized just has to be formed in the half-finished product, for example, based on the purchase orders or the demands. Therefore, it is possible to prevent having a large inventory of the product with few purchase orders to be placed, and it is also possible to prevent manufacturing a large quantity of outside specification products.

Second Embodiment

Then, a semiconductor laser and a manufacturing method thereof concerning a second embodiment of the present invention will be described with reference to FIG. 5 to FIG. 7.

The semiconductor laser concerning this embodiment differs from the above-described first embodiment in the point that the diffraction grating 13 is formed in the p-type doped GaInAs contact layer 11 without removing the p-type doped GaInAs contact layer 11.

Namely, the semiconductor laser concerning this embodiment is a semiconductor laser (a buried semiconductor laser; DFB laser) having the buried hetero-structure (BH structure), and, as shown in FIG. 5, is configured as including: the n-type doped InP substrate (a semiconductor substrate, a cladding layer) 1, the quantum well active layer (a waveguide, a core layer) 3 in which an undoped GaInAsP layer (a quantum well layer; with a thickness of 5.1 nm) and an undoped GaInAsP (a barrier layer; with a thickness of 10 nm, a composition wavelength of 1300 nm) are stacked repeatedly 7 times; the p-type doped InP layer (an electric-current constriction layer) 4; the n-type doped InP layer (an electric-current constriction layer) 5; the p-type doped InP layer (a cladding layer) 6; the n-side electrode 9; the p-type doped GaInAs layer (a contact layer) 11; the p-side electrode 12; and the diffraction grating 13.

Figure 5:
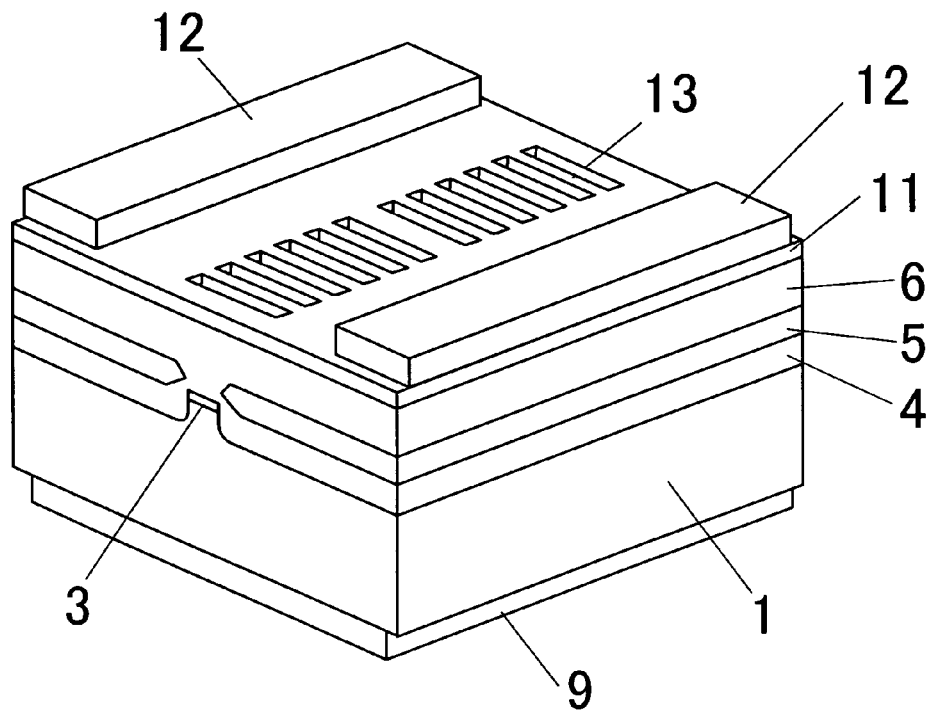
FIG. 5 is an illustrative perspective view showing a structure of a semiconductor laser concerning a second embodiment of the present invention.

Here, as shown in FIG. 5, the quantum well active layer 3, the p-type doped InP electric-current constriction layer 4, the n-type doped InP electric-current constriction layer 5, the p-type doped InP cladding layer 6 formed on the quantum well active layer 3, and the p-type doped GaInAs contact layer 11 being the top layer formed on the p-type doped InP cladding layer 6 are formed by stacking on the n-type doped InP substrate 1. For this reason, these are collectively referred to as the semiconductor stacking body.

Moreover, here, a mesa-structure is formed so as to extend in the optical axis direction of the laser, and in the opposite sides thereof the n-type doped InP substrate 1, the p-type doped InP electric-current constriction layer 4, the n-type doped InP electric-current constriction layer 5, and the p-type doped InP cladding layer 6 are stacked to constitute an electric-current constriction structure of these layers. Namely, here, the electric-current constriction structure is the pnpn thyristor structure.

Moreover, as shown in FIG. 5, the diffraction grating 13 is formed in the p-type doped GaInAs contact layer 11 and in the p-type doped GaInAs layer 11 of the upper region of the quantum well active layer 3. Namely, the diffraction grating 13 is formed in parallel along the quantum well active layer 3 in the region having a predetermined width right above the quantum well active layer 3 so as to extend from the surface (namely, the surface at the crystal growth side of the semiconductor stacking body; the surface of the semiconductor crystal) of the p-type doped GaInAs contact layer 11 formed on the n-type doped InP substrate 1 by a crystal growth (for example, an epitaxial growth) to the p-type doped InP cladding layer 6.

Incidentally, while in this case the diffraction grating 13 is formed in the p-type doped GaInAs contact layer 11 and the p-type doped cladding layer 6, the present invention is not limited to this. For example, if the thickness of the p-type doped GaInAs contact layer 11 is thick and the thickness of the p-type doped InP cladding layer 6 is thin, the diffraction grating 13 may be formed only in the p-type doped GaInAs contact layer 11.

Moreover, in the case where the diffraction grating 13 is formed so as to appear in the surface of the p-type doped GaInAs contact layer 11, the diffraction grating 13 is provided in the position further away from the quantum well active layer 3 than in the case where the diffraction grating 13 is formed in the guide layer adjacent to the active layer. Therefore, it is necessary to make the depth of the groove of the diffraction grating 13 deeper.

Thus, in this embodiment, because the diffraction grating 13 is formed so as to appear in the surface of the p-type doped GaInAs contact layer 11, the p-side electrode 12 is formed in the region in which the diffraction grating 13 is not formed in the surface of the p-type doped GaInAs contact layer 11, as shown in FIG. 5. Namely, the p-side electrode 12 is formed in parallel along the region (namely, the region having a predetermined width right above the quantum well active layer 3) where the diffraction grating 13 is formed, in the opposite sides of the region in which the diffraction grating 13 is formed.

Incidentally, between the p-type doped InP cladding layer 6 and the p-type doped GaInAs contact layers 11, one layer or a plurality of layers of the p-type doped GaInAsP may be provided. Thereby, the resistance of the device can be reduced.

Then, the manufacturing method of the semiconductor laser concerning this embodiment will be described.

First, the semiconductor stacking body is manufactured by the same method as the above-described first embodiment (process of manufacturing the semiconductor stacking body, process of manufacturing semiconductor crystals).

Figure 6:
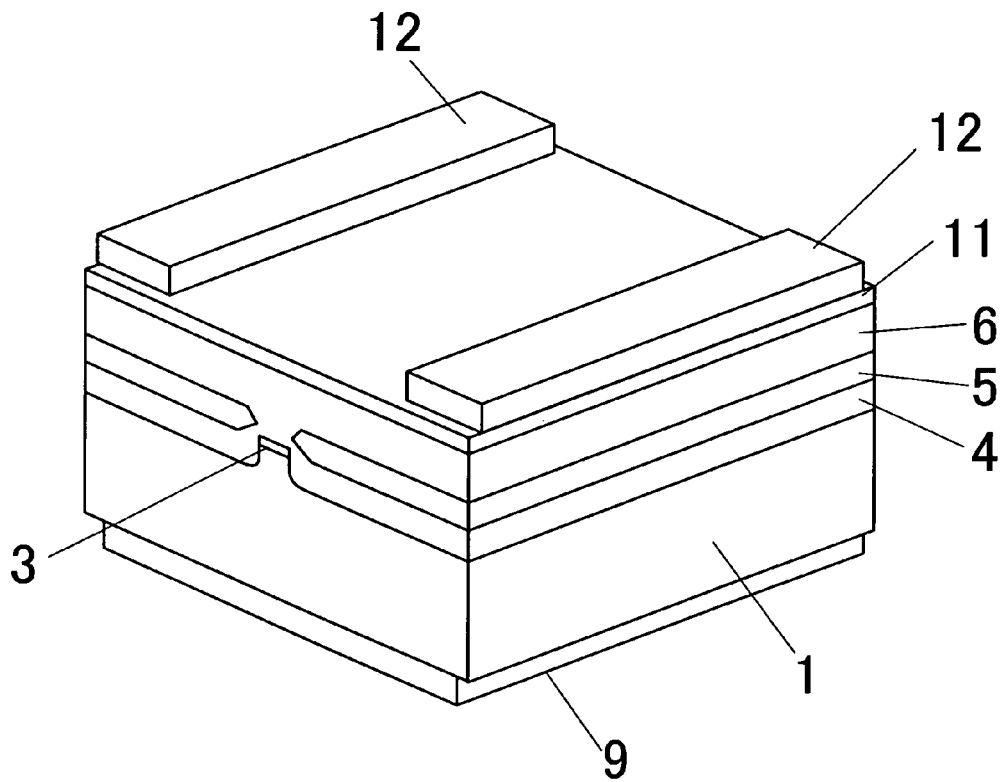
FIG. 6 is an illustrative perspective view showing a structure of a half-finished product of the semiconductor laser concerning the second embodiment of the present invention.

Then, as shown in FIG. 6, two belt-like p-side electrodes 12 are formed in parallel along the quantum well active layer 3 (in the optical axis direction of the laser), in the opposite sides of the region having a predetermined width (for example, a width of approximately 5 μm to approximately 50 μm) in the direction perpendicular to the optical axis of the laser.

In this way, as shown in FIG. 6, firstly, a half-finished product in which the diffraction grating 13 is not formed is manufactured (process of manufacturing the half-finished product).

Note that, while here the half-finished product is configured as including the p-side electrode 12, the present invention is not limited to this. For example, the half-finished product may be configured as not including the p-side electrode 12. In this case, the half-finished product will be configured as the semiconductor stacking body (a semiconductor crystal) consisting of only the semiconductor layers.

Then, the semiconductor laser for evaluation is manufactured by the same method as that of the above-described first embodiment.

Figure 7:
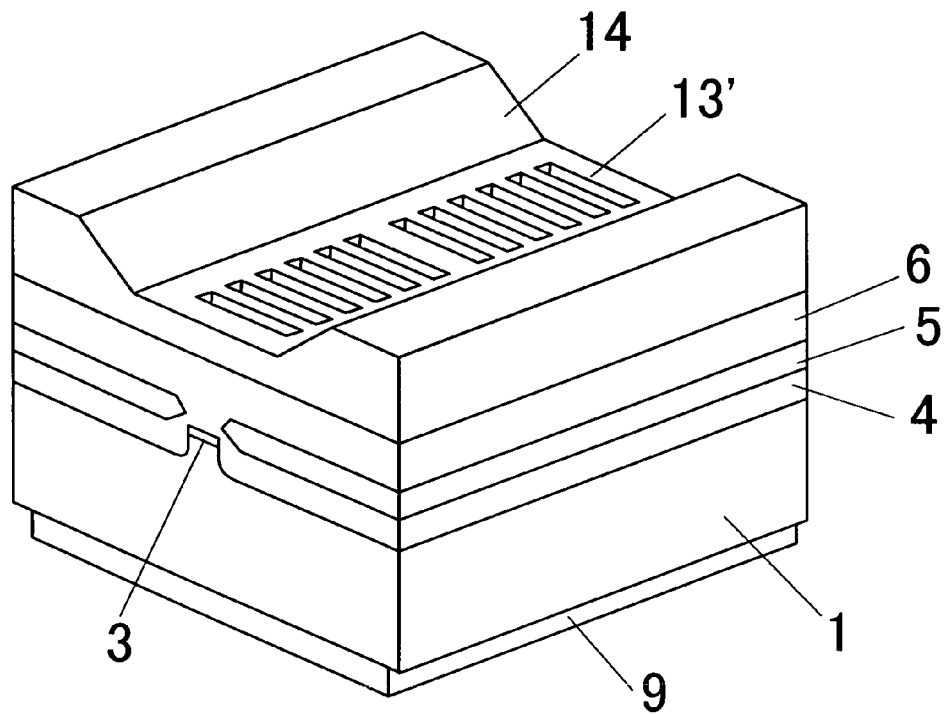
FIG. 7 is an illustrative perspective view for explaining a process of forming a diffraction grating in a manufacturing method of the semiconductor laser concerning the second embodiment of the present invention.

Namely, the diffraction grating pattern 13' is formed by applying the photoresist 14 to one half-finished product (device) manufactured as described above and by an exposure (for example, the interference exposure, the electron beam (EB) exposure or the like), as shown in FIG. 7.

Next, after having transferred the diffraction grating pattern 13' onto the p-type doped GaInAs contact layer 11 and the p-type doped InP cladding layer 6 by dry etching, the resist 14 is removed (peeled off).

In this way, the semiconductor laser for evaluation (device) in which the diffraction grating 13 is formed is manufactured (refer to FIG. 5). Namely, the semiconductor laser for evaluation is manufactured by forming the diffraction grating 13 along the quantum well active layer 3 in the region having a predetermined width right above the quantum well active layer 3 so as to extend from the surface (namely, the surface at the crystal growth side of the semiconductor stacking body; the surface of the semiconductor crystal) of the p-type doped GaInAs contact layer 11 manufactured as described above to the P type doped InP cladding layer 6 (process of manufacturing the semiconductor laser for evaluation).

Then, with the same method as the above-described first embodiment, the period of the diffraction grating 13 is determined (process of determining the period of the diffraction grating).

Then, with the same method as the above-described first embodiment, the semiconductor laser having the desired oscillation wavelength is manufactured.

Namely, the diffraction grating 13 having the period determined by the same manufacturing process (refer to FIG. 7) as the process of the above-described semiconductor laser for evaluation is formed in the half-finished product manufactured as described above. Namely, the diffraction grating 13 having the determined period is formed along the quantum well active layer 3 in the region having a predetermined width right above the quantum well active layer 3 so as to extend from the surface (namely, the surface at the crystal growth side of the semiconductor stacking body; the surface of the semiconductor crystal) of the p-type doped GaInAs contact layer 11 of the half-finished product to the p-type doped InP cladding layer 6. Thereby, the semiconductor laser having the desired oscillation wavelength is manufactured (process of manufacturing the semiconductor laser, process of manufacturing the finished product).

In addition, in the case where the diffraction grating 13 is formed only in the p-type doped GaInAs contact layer 11, the diffraction grating 13 just has to be formed so as to extend from the surface of the p-type doped GaInAs contact layer 11 of the half-finished product to the inside thereof by transferring the diffraction grating pattern 13' only onto the p-type doped GaInAs contact layer 11.

Thus, in this embodiment, after having formed on the n-type doped InP substrate 1 the semiconductor stacking body including the quantum well active layer 3, the diffraction grating 13 is formed in the upper region of the quantum well active layer 3 so as to appear in the surface of the semiconductor stacking body.

Therefore, according to the semiconductor laser and the manufacturing method thereof concerning this embodiment, the same operation and effect as those of the above-described first embodiment are obtained.

Third Embodiment

Then, a semiconductor laser and a manufacturing method thereof concerning a third embodiment of the present invention will be described with reference to FIG. 8 to FIG. 10.

The semiconductor laser concerning this embodiment differs in the point that the semiconductor laser concerning this embodiment is a semiconductor laser having a semi-insulating buried hetero-structure (SI-BH structure), while the semiconductor laser in the above-described second embodiment is a semiconductor laser having the buried hetero-structure (BH structure).

Figure 8:
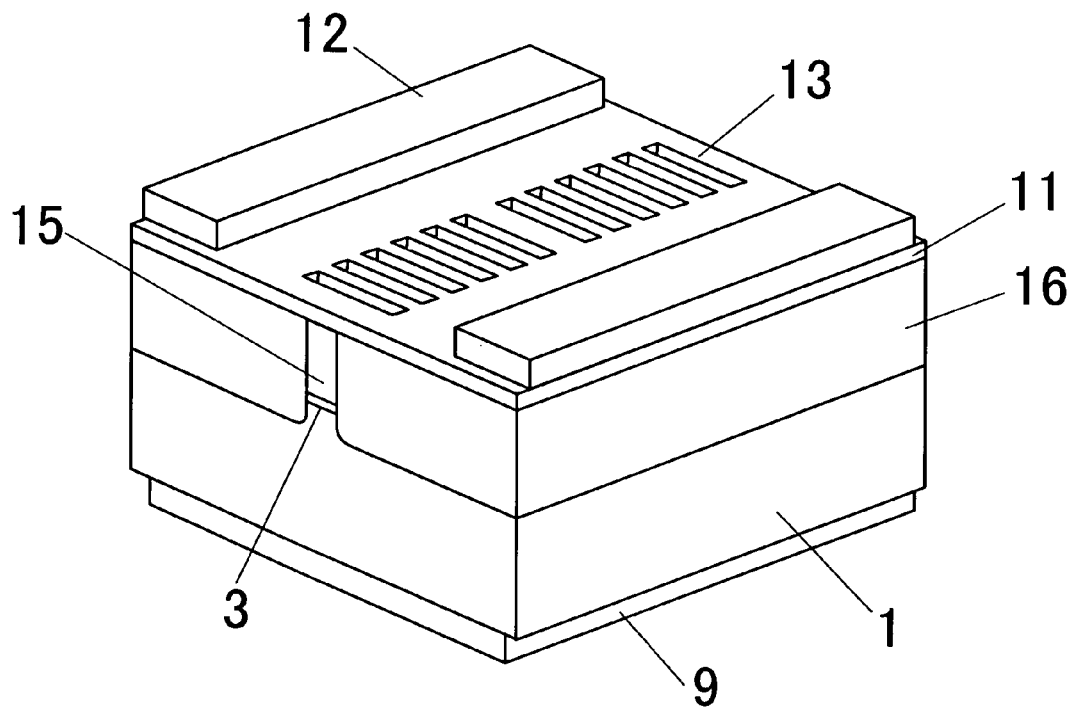
FIG. 8 is an illustrative perspective view showing a structure of a semiconductor laser concerning a third embodiment of the present invention.

Namely, the semiconductor laser concerning this embodiment is a semiconductor laser (a buried-type semiconductor laser; a DFB laser) having the semi-insulating buried hetero-structure (SI-BH structure), and, as shown in FIG. 8, is configured as including: the n-type doped InP substrate (a semiconductor substrate, a cladding layer) 1; the quantum well active layer (a waveguide, a core layer) 3 in which an undoped GaInAsP layer (a quantum well layer; with a thickness of 5.1 nm) and an undoped GaInAsP (a barrier layer; with a thickness of 10 nm, a composition wavelength of 1300 nm) are stacked repeatedly 7 times; a p-type doped InP layer (a cladding layer) 15; a Fe doped semi-insulating InP layer (an electric-current constriction layer) 16; the p-type doped GaInAs layer (a contact layer) 11; the p-side electrode 12; the n-side electrode 9; and the diffraction grating 13.

Here, as shown in FIG. 8, the quantum well active layer 3, the p-type doped InP cladding layer 15 formed on the quantum well active layer 3, the Fe doped semi-insulating InP electric-current constriction layer 16, and the p-type doped GaInAs contact layer 11 being the top layer formed on the p-type doped InP cladding layer 15 and the Fe doped semi-insulating InP electric-current constriction layer 16 are formed by stacking on the n-type doped InP substrate 1. For this reason, these are collectively referred to as the semiconductor stacking body.

Moreover, here, a mesa-structure is formed so as to extend in the optical axis direction of the laser, and in the opposite sides thereof the Fe doped semi-insulating InP electric-current constriction layer (a semi-insulating semiconductor layer) 16 is formed to constitute the electric-current constriction structure by these layers. Namely, here, the electric-current constriction structure is constituted of the SI-BH structure that includes the semi-insulating semiconductor layer.

Moreover, as shown in FIG. 8, the diffraction grating 13 is formed in the p-type doped GaInAs contact layer 11 of the upper region of the quantum well active layer 3, the p-type doped InP cladding layer 15, and the Fe doped semi-insulating InP electric-current constriction layer 16. Namely, the diffraction grating 13 is formed in parallel along the quantum well active layer 3 in the region having a predetermined width right above the quantum well active layer 3 so as to extend from the surface (namely, the surface at the crystal growth side of the semiconductor stacking body: the surface of the semiconductor crystal) of the p-type doped GaInAs contact layer 11 formed on the n-type doped InP substrate 1 by the crystal growth (for example, the epitaxial growth), to the p-type doped InP cladding layer 15 and the Fe doped semi-insulating InP electric-current constriction layer 16.

In addition, while here the diffraction grating 13 is formed in the p-type doped GaInAs contact layer 11, the p-type doped InP cladding layer 15, and the Fe doped semi-insulating InP electric-current constriction layer 16, the present invention is not limited to this. For example, if the thickness of the p-type doped GaInAs contact layer 11 is thick, and the thicknesses of the p-type doped InP cladding layer 15 and the Fe doped semi-insulating InP electric-current constriction layer 16 are thin, the diffraction grating 13 may be formed only in the p-type doped GaInAs contact layer 11. Moreover, if the width (the width in the direction perpendicular to the optical axis of the laser) of the diffraction grating 13 is allowed to be small, the diffraction grating 13 may be formed only in the p-type doped GaInAs contact layer 11 and the p-type doped InP cladding layer 15.

Note that the rest of the structure is the same as that of the above-described second embodiment.

Moreover, one layer or a plurality of layers of the p-type doped GaInAsP may be provided between the Fe doped semi-insulating InP electric-current constriction layer 16 or the p-type doped Inp cladding layer 15, and the p-type doped GaInAs contact layer 11. Thereby, the resistance of the device can be reduced.

Then, the manufacturing method of the semiconductor laser concerning this embodiment will be described.

First, with the manufacturing method of the semiconductor laser of the semi-insulating buried hetero-structure (SI-BH structure) of the general Fabry-Perot type, the semiconductor stacking body configured of the quantum well active layer 3, the p-type doped InP cladding layer 15, the Fe doped semi-insulating InP electric-current constriction layer 16, and the p-type doped GaInAs contact layer 11 is manufactured (process of manufacturing the semiconductor stacking body, process of manufacturing semiconductor-crystals).

Figure 9:
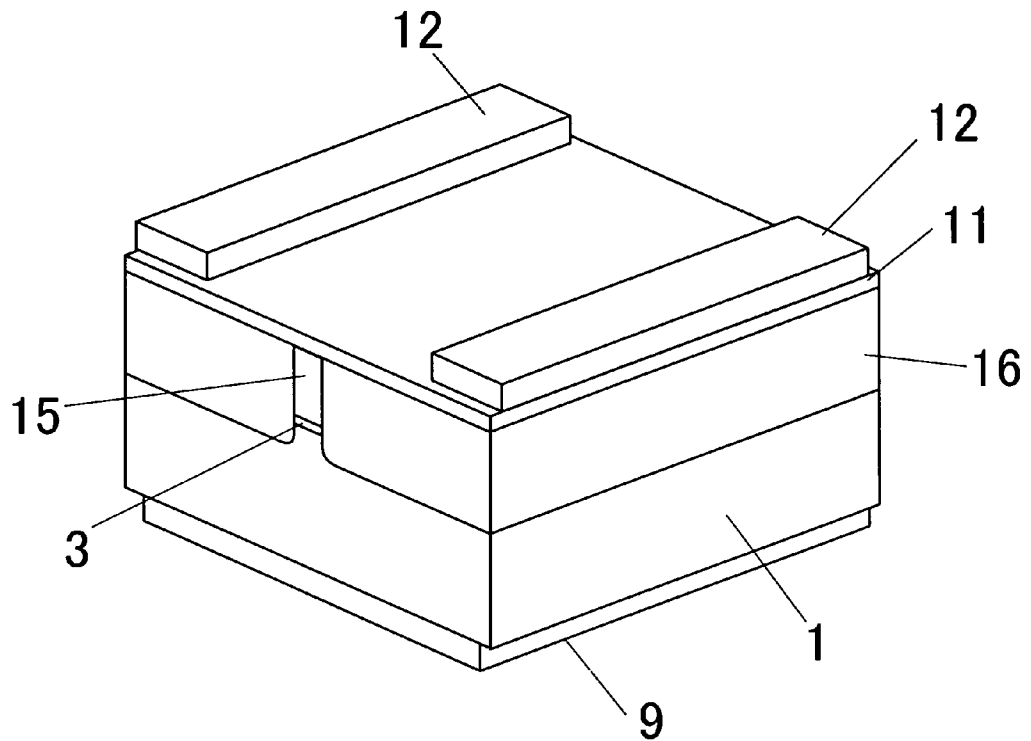
FIG. 9 is an illustrative perspective view showing a structure of a half-finished product of the semiconductor laser concerning the third embodiment of the present invention.

Then, as shown in FIG. 9, two belt-like p-side electrodes 12 are formed like the above-described second embodiment.

In this way, as shown in FIG. 9, firstly, a half-finished product in which the diffraction grating 13 is not formed is manufactured (process of manufacturing the half-finished product).

Note that, while here the half-finished product is configured as including the p-side electrode 12, the present invention is not limited to this. For example, the half-finished product may be configured as not including the p-side electrode 12. In this case, the half-finished product will be configured as the semiconductor stacking body (a semiconductor crystal) consisting of only the semiconductor layers.

Then, the semiconductor laser for evaluation is manufactured by the same method as that of the above-described second embodiment.

Figure 10:
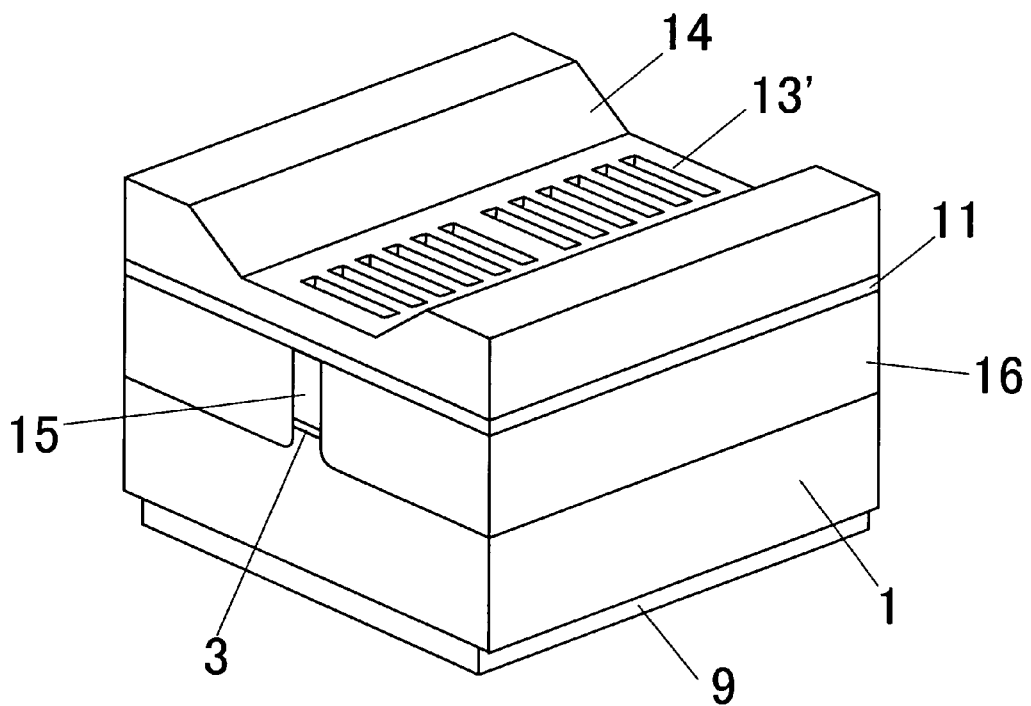
FIG. 10 is an illustrative perspective view for explaining a process of forming a diffraction grating in a manufacturing method of the semiconductor laser concerning the third embodiment of the present invention.

Namely, the diffraction grating pattern 13 is formed by applying the photoresist 14 to one half-finished product (device) manufactured as described above and by the exposure (for example, the interference exposure, the electron beam (EB) exposure or the like), as shown in FIG. 10.

Next, the resist 14 is removed (peeled off) after having transcripted the diffraction grating pattern 13' onto the p-type doped GaInAs contact layer 11, the p-type doped InP cladding layer 15, and the Fe doped semi-insulating InP electric-current constriction layer 16 by dry etching.

In this way, the semiconductor laser for evaluation (device) in which the diffraction grating 13 is formed is manufactured (refer to FIG. 8). Namely, the semiconductor laser for evaluation is manufactured by forming the diffraction grating 13 along the quantum well active layer 3 in the region having a predetermined width right above the quantum well active layer 3 so as to extend from the surface (namely, the surface at the crystal growth side of the semiconductor stacking body; the surface of the semiconductor crystal) of the p-type doped GaInAs contact layer 11 formed as described above to the p-type doped InP cladding layer 15 and the Fe doped semi-insulating InP electric-current constriction layer 16 (process of manufacturing the semiconductor laser for evaluation).

Then, with the same method as the above-described second embodiment, the period of the diffraction grating 13 is determined (process of determining the period of the diffraction grating).

Then, with the same method as the above-described second embodiment, the semiconductor laser having the desired oscillation wavelength is manufactured.

Namely, the diffraction grating 13 having the determined period is formed in the half-finished product manufactured as described above by the same manufacturing process (refer to FIG. 10) as the process of the above-described semiconductor laser for evaluation. Namely, the diffraction grating 13 having the determined period is formed along the quantum well active layer 3 in the region having a predetermined width right above the quantum well active layer 3 so as to extend from the surface (namely, the surface at the crystal growth side of the semiconductor stacking body; the surface of the semiconductor crystal) of the p-type doped GaInAs contact layer 11 of the half-finished product to the p-type doped InP cladding layer 15 and the Fe doped semi-insulating InP electric-current constriction layer 16. Thereby, the semiconductor laser having the desired oscillation wavelength is manufactured (process of manufacturing the semiconductor laser, process of manufacturing the finished product).

In addition, in the case where the diffraction grating 13 is formed only in the p-type doped GaInAs contact layer 11, the diffraction grating 13 just has to be formed so as to extend from the surface of the p-type doped GaInAs contact layer 11 of the half-finished product to the inside thereof by transferring the diffraction grating pattern 13' only to the p-type doped GaInAs contact layer 11. Moreover, in the case where the diffraction grating 13 is formed only in the p-type doped GaInAs contact layer 11 and the p-type doped InP cladding layer 15, the diffraction grating 13 just has to be formed so as to extend from the surface of the p-type doped GaInAs contact layer 11 of the half-finished product to the p-type doped InP cladding layer 15 by transferring the diffraction grating pattern 13' only onto the p-type doped GaInAs contact layer 11 and the p-type doped InP cladding layer 15.

Thus, in this embodiment, after having formed on the n-type doped InP substrate 1 the semiconductor stacking body which includes the quantum well active layer 3, the diffraction grating 13 is formed in the upper region of the quantum well active layer 3 so as to appear in the surface of the semiconductor stacking body.

Therefore, according to the semiconductor laser and the manufacturing method thereof concerning this embodiment, the same operation and effect as those of the above-described second embodiment are obtained.

Fourth Embodiment

Then, a semiconductor laser and a manufacturing method thereof concerning a fourth embodiment of the present invention will be described with reference to FIG. 11 to FIG. 13.

The semiconductor laser concerning this embodiment differs in the point that the semiconductor laser concerning this embodiment is a semiconductor laser having a semi-insulating planar buried hetero-structure (SI-PBH structure), while the semiconductor laser of the above-described first embodiment is a semiconductor laser having the buried hetero-structure (BH structure).

Figure 11:
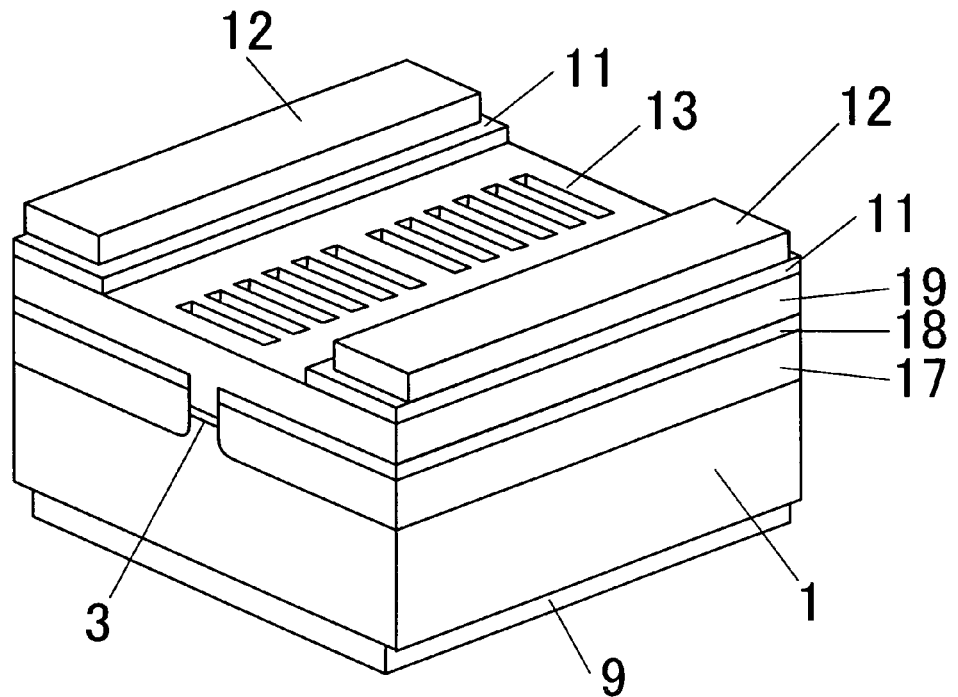
FIG. 11 is an illustrative perspective view showing a structure of a semiconductor laser concerning a fourth embodiment of the present invention.

Namely, the semiconductor laser concerning this embodiment is a semiconductor laser (a buried-type semiconductor laser; a DFB laser) having the semi-insulating planar buried hetero-structure (SI-PBH structure), and as shown in FIG. 11, is configured as including the n-type doped InP substrate (a semiconductor substrate, a cladding layer) 1, the quantum well active layer (a waveguide, a core layer) 3 in which an undoped GaInAsP layer (a quantum well layer; with a thickness of 5.1 nm) and an undoped GaInAsP (a barrier layer; with a thickness of 10 nm, a composition wavelength of 1300 nm) are stacked repeatedly 7 times; a Fe doped semi-insulating InP layer (an electric-current constriction layer) 17, an n-type doped InP layer (an electric-current constriction layer) 18, a p-type doped InP layer (a cladding layer) 19, the p-type doped GaInAs layer (a contact layer) 11, the p-side electrode 12, the n-side electrode 9, and the diffraction grating 13.

Here, as shown in FIG. 11, the quantum well active layer 3, the p-type doped InP cladding layer 19 formed on the quantum well active layer 3, the Fe doped semi-insulating InP electric-current constriction layer 17, the n-type doped InP electric-current constriction layer 18, and the p-type doped GaInAs contact layer 11 being the top layer formed on the p-type doped InP cladding layer 19 are formed by stacking the semiconductor layers on the n-type doped InP substrate 1. For this reason, these are collectively referred to as the semiconductor stacking body.

Moreover, here, a mesa-structure is formed so as to extend in the optical axis direction of the laser, and in the opposite sides thereof the Fe doped semi-insulating InP electric-current constriction layer (a semi-insulating semiconductor layer) 17 and the n-type doped InP electric-current constriction layer 18 are formed to constitute the electric-current constriction structure of these layers. Namely, here, the electric-current constriction structure is constituted of the SI-PBH structure which includes the semi-insulating semiconductor layer.

In addition, as shown in FIG. 11, the diffraction grating 13 is formed in the p-type doped InP cladding layer 19 in the upper region of the quantum well active layer 3. Namely, the diffraction grating 13 is formed in parallel along the quantum well active layer 3 in the region having a predetermined width right above the quantum well active layer 3 so as to extend from the surface (namely, the surface at the crystal growth side of a semiconductor stacking body; surface of a semiconductor crystal) of the p-type doped InP cladding layer 19 formed on the n-type doped InP substrate 1 by the crystal growth (for example, the epitaxial growth), to the inside of the p-type doped InP cladding layer 19.

Incidentally, while here the diffraction grating 13 is formed in the p-type doped InP cladding layer 19, the present invention is not limited to this. For example, the diffraction grating 13 may be formed so as to extend from the surface of the p-type doped InP cladding layer 19 to the Fe doped semi-insulating InP electric-current constriction layer 17 or to the n-type doped InP electric-current constriction layer 18.

Note that the rest of the structure is the same as that of the above-described first embodiment.

Moreover, between the p-type doped InP cladding layer 19 and the p-type doped GaInAs contact layers 11, one layer or a plurality of layers of the p-type doped GaInAsP may be provided. Thereby, the resistance of the device can be reduced.

Then, the manufacturing method of the semiconductor laser concerning this embodiment will be described.

First, with the manufacturing method of the semiconductor laser of the semi-insulating planar buried hetero-structure (SI-PBH structure) of the general Fabry-Perot type, the semiconductor stacking body constituted of the quantum well active layer 3, the p-type doped InP cladding layer 19, the Fe doped semi-insulating InP electric-current constriction layer 17, the n-type doped InP electric-current constriction layer 18, and the p-type doped GaInAs contact layer 11 is manufactured (process of manufacturing the semiconductor stacking body, process of manufacturing semiconductor-crystals).

Figure 12:
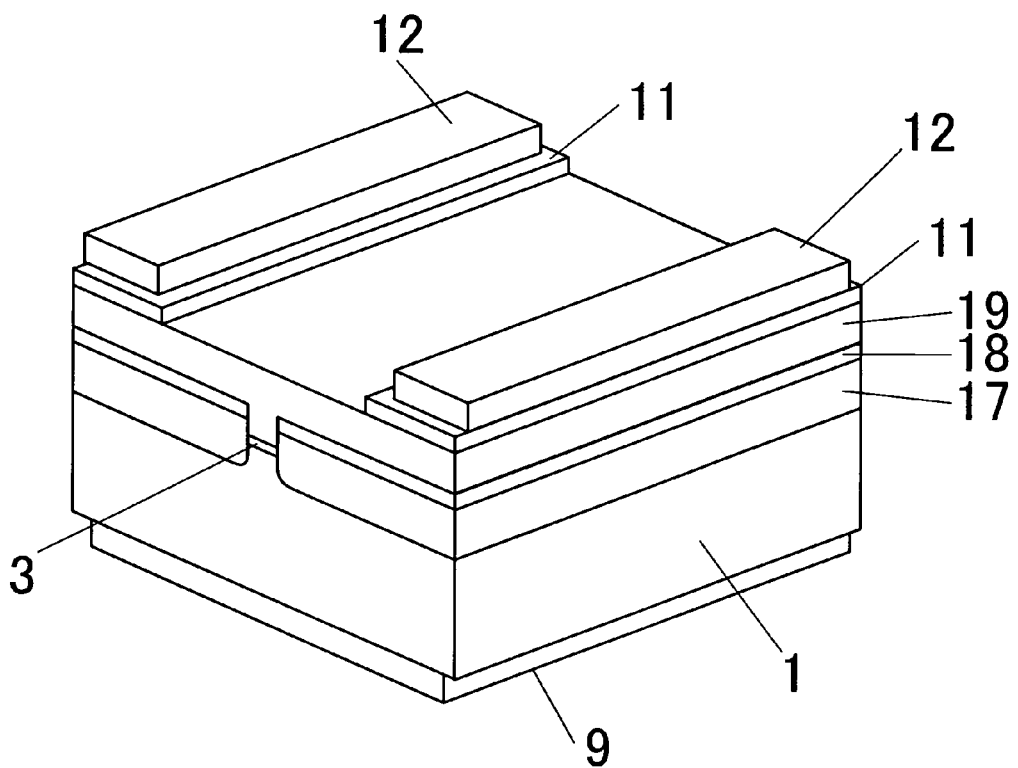
FIG. 12 is an illustrative perspective view showing a structure of a half-finished product of the semiconductor laser concerning the fourth embodiment of the present invention.

Next, with the same method as the above-described first embodiment, as shown in FIG. 12, a half-finished product in which the diffraction grating 13 is not formed is manufactured (process of manufacturing the half-finished product).

Then, the semiconductor laser for evaluation is manufactured by the same method as that of the above-described first embodiment.

Figure 13:
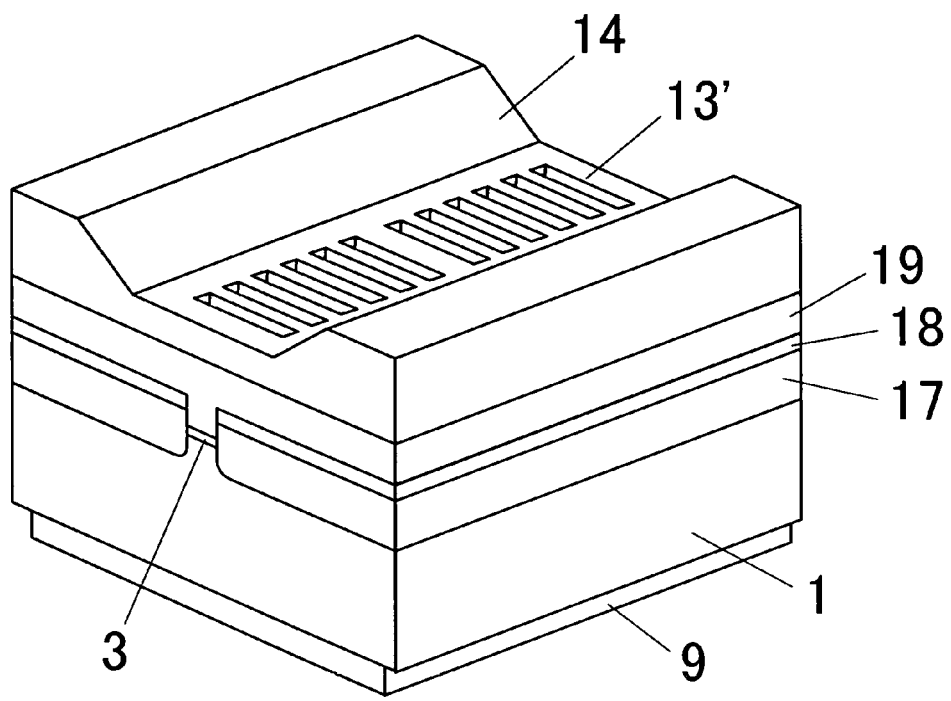
FIG. 13 is an illustrative perspective view for explaining a process of forming a diffraction grating in a manufacturing method of the semiconductor laser concerning the fourth embodiment of the present invention.

Namely, the diffraction grating pattern 13' is formed by applying the photoresist 14 to one half-finished product (device) manufactured as described above and by the exposure (for example, the interference exposure, the electron beam (EB) exposure or the like), as shown in FIG. 13.

Next, after having transferred the diffraction grating pattern 13' onto the p-type doped InP cladding layer 19 by dry etching, the resist 14 is removed (peeled off).

Thus, the semiconductor laser for evaluation (device) in which the diffraction grating 13 is formed is manufactured (refer to FIG. 11). Namely, the semiconductor laser for evaluation is manufactured by forming the diffraction grating 13 along the quantum well active layer 3 in the region having a predetermined width right above the quantum well active layer 3 so as to extend from the surface (namely, the surface at the crystal growth side of the semiconductor stacking body; the surface of the semiconductor crystal) of the p-type doped InP cladding layer 19 of the half-finished product formed as described above to the inside thereof (process of manufacturing the semiconductor laser for evaluation).

Then, with the same method as the above-described first embodiment, the period of the diffraction grating 13 is determined (process of determining the period of the diffraction grating).

Then, with the same method as the above-described first embodiment, the semiconductor laser having the desired oscillation wavelength is manufactured.

Namely, the diffraction grating 13 having the determined period is formed in the half-finished product manufactured as described above by the same manufacturing process (refer to FIG. 13) as the process of the above-described semiconductor laser for evaluation. Namely, the diffraction grating 13 having the determined period is formed along the quantum well active layer 3 in the region having a predetermined width right above the quantum well active layer 3 so as to extend from the surface (namely, the surface at the crystal growth side of the semiconductor stacking body; the surface of the semiconductor crystal) of the p-type doped InP cladding layer 19 of the half-finished product to the inside thereof. Thereby, the semiconductor laser having the desired oscillation wavelength is manufactured (process of manufacturing the semiconductor laser, process of manufacturing the finished product).

In addition, the diffraction grating 13 may be formed so as to extend from the surface of the p-type doped InP cladding layer 19 to the Fe doped semi-insulating InP electric-current constriction layer 17 or the n-type doped InP electric-current constriction layer 18 by transferring the diffraction grating pattern 13' onto the p-type doped GaInAs contact layer 11, and the Fe doped semi-insulating InP electric-current constriction layer 17 or the n-type doped InP electric-current constriction layer 18.

Thus, in this embodiment, after having formed on the n-type doped InP substrate 1 the semiconductor stacking body which includes the quantum well active layer 3, the diffraction grating 13 is formed in the upper region of the quantum well active layer 3 so as to appear in the surface of the semiconductor stacking body.

Therefore, according to the semiconductor laser and the manufacturing method thereof concerning this embodiment, the same operation and effect as those of the above-described first embodiment are obtained.

In addition, while in this embodiment, like the above-described first embodiment, the diffraction grating 13 is formed so as to appear in the surface of the p-type doped InP cladding layer 19 by removing a part of the p-type doped GaInAS contact layer 11, the present invention is not limited to this. For example, the diffraction grating 13 may be formed so as to appear in the surface of the p-type doped GaInAs contact layer 11 without removing the p-type doped GaInAs contact layer 11 like the above-described second embodiment.

Fifth Embodiment

Then, a semiconductor laser and a manufacturing method thereof concerning a fifth embodiment of the present invention will be described with reference to FIG. 14 to FIG. 16.

The semiconductor laser concerning this embodiment differs in the point that the semiconductor laser concerning this embodiment is a semiconductor laser having an inner stripe structure, while the semiconductor laser in the above-described second embodiment is a semiconductor laser having the buried hetero-structure (BH structure).

Figure 14:
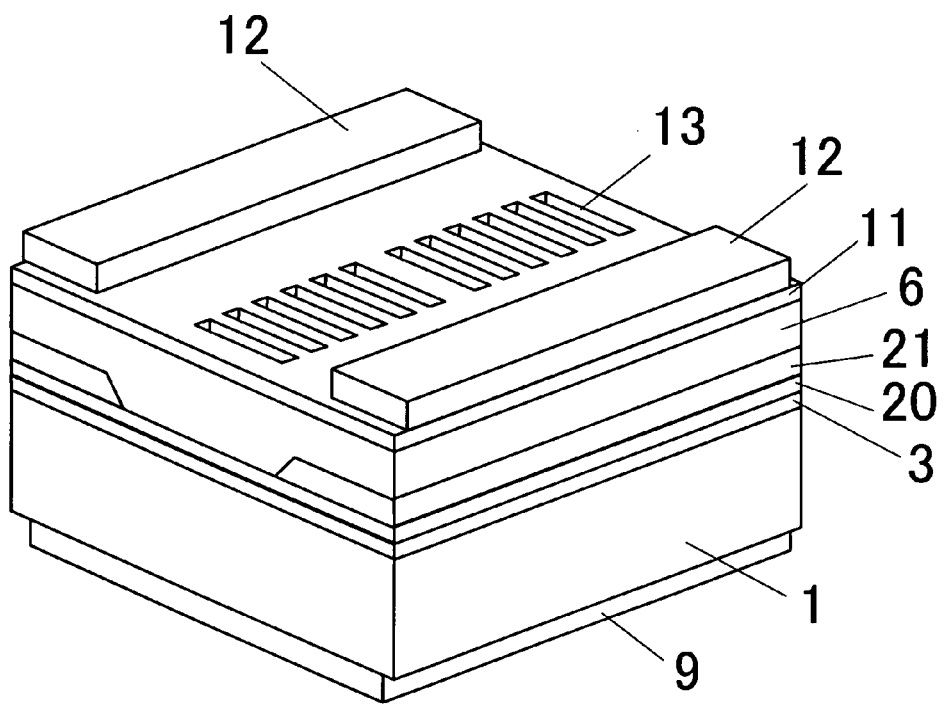
FIG. 14 is an illustrative perspective view showing a structure of a semiconductor laser concerning a fifth embodiment of the present invention.

Namely, the semiconductor laser concerning this embodiment is the inner stripe type semiconductor laser (DFB laser), and as shown in FIG. 14, is configured as including: the n-type doped InP substrate (a semiconductor substrate, a cladding layer) 1; the quantum well active layer (a waveguide, a core layer) 3 in which an undoped GaInAsP layer (a quantum well layer; with a thickness of 5.1 nm) and an undoped GaInAsP (a barrier layer; with a thickness of 10 nm, a composition wavelength of 1300 nm) are stacked repeatedly 7 times; the p-type doped InP layer (a cladding layer) 6; a p-type doped GaInAs layer 20 (a guide layer; an etch-stopping layer; a guide and etch-stopping layer; with a thickness of 150 nm); an n-type doped InP layer (an electric-current constriction layer) 21; the p-type doped GaInAs layer (contact layer) 11; the p-side electrode 12, the n-side electrode 9; and the diffraction grating 13.

Here, as shown in FIG. 14, the quantum well active layer 3, the p-type doped GaInAs guide and etch-stopping layer 20, the n-type doped InP electric-current constriction layer 21, the p-type doped InP cladding layer 6 formed above the quantum well active layer 3, and the p-type doped GaInAs contact layer 11 being the top layer formed on the p-type doped InP cladding layer 6 are formed by stacking on the n-type doped InP substrate 1. For this reason, these are collectively referred to as the semiconductor stacking body.

Moreover, here, in the opposite side portions of the optical axis direction of the laser of the quantum well active layer 3, on the n-type doped InP substrate 1, the p-type doped GaInAs guide and etch-stopping layer 20, the n-type doped InP electric-current constriction layers 21, and the p-type doped InP cladding layer 6 are stacked to constitute the electric-current constriction structure of these substrate and the respective layers. More specifically, the electric-current constriction structure is constituted of a pn junction comprising the p-type doped GaInAs guide and etch-stopping layer 20, and the n-type doped InP electric-current constriction layer 21.

Moreover, as shown in FIG. 14, the diffraction grating 13 is formed in the p-type doped GaInAs contact layer 11 and the p-type doped InP cladding layer 6 of the upper region of the quantum well active layer 3. Namely, the diffraction grating 13 is formed in parallel along the quantum well active layer 3 in the region having a predetermined width right above the quantum well active layer 3 so as to extend from the surface (namely, the surface at the crystal growth side of the semiconductor stacking body; the surface of the semiconductor crystal) of the p-type doped GaInAs contact layer 11 formed on the n-type doped InP substrate 1 by the crystal grow (for example, the epitaxial grow), to the p-type doped InP cladding layer 6.

In addition, while here the diffraction grating 13 is formed in the p-type doped GaInAs contact layer 11 and the p-type doped InP cladding layer 6, the present invention is not limited to this. For example, if the thickness of the p-type doped GaInAs contact layer 11 is thick and the thickness of the p-type doped InP cladding layer 6 is thin, the diffraction grating 13 may be formed only in the p-type doped GaInAs contact layer 11. For example, the diffraction grating 13 may be formed so as to extend from the surface of the p-type doped InP cladding layer 6 to the p-type doped GaInAs guide and etch-stopping layer 20 or the n-type doped InP electric-current constriction layer 21.

Note that the rest of the structure is the same as that of the above-described second embodiment.

Incidentally, between the p-type doped InP cladding layer 6 and the p-type doped GaInAs contact layers 11, one layer or a plurality of layers of the p-type doped GaInAsP may be provided. Thereby, the resistance of the device can be reduced.

Then, the manufacturing method of the semiconductor laser concerning this embodiment will be described.

First, with the manufacturing method of the inner stripe type semiconductor laser of the general Fabry-Perot type, the semiconductor stacking body constituted of the quantum well active layer 3, the p-type doped GaInAs guide and etch-stopping layer 20, the n-type doped InP electric-current constriction layer 21, the p-type doped InP cladding layer 6, and the p-type doped GaInAs contact layer 11 is manufactured (process of manufacturing the semiconductor stacking body, process of manufacturing semiconductor-crystals).

Figure 15:
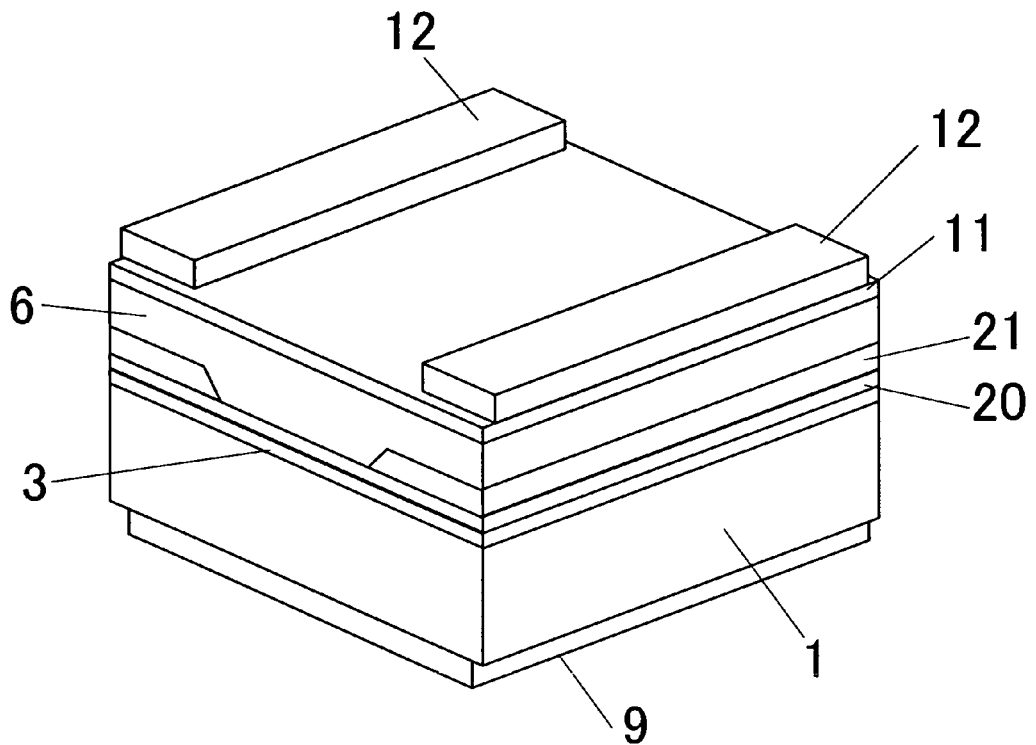
FIG. 15 is an illustrative perspective view showing a structure of a half-finished product of the semiconductor laser concerning the fifth embodiment of the present invention.

Then, two belt-like p-side electrodes 12 are formed like the above-described second embodiment, as shown in FIG. 15.

In this way, firstly, a half-finished product in which the diffraction grating 13 is not formed, as shown in FIG. 15, is manufactured (process of manufacturing the half-finished product).

Note that, while here the half-finished product is configured including the p-side electrode 12, the present invention is not limited to this. For example, the half-finished product may be configured as not including the p-side electrode 12. In this case, the half-finished product will be configured as the semiconductor stacking body (a semiconductor crystal) consisting of only the semiconductor layers.

Then, the semiconductor laser for evaluation is manufactured by the same method as that of the above-described second embodiment.

Figure 16:
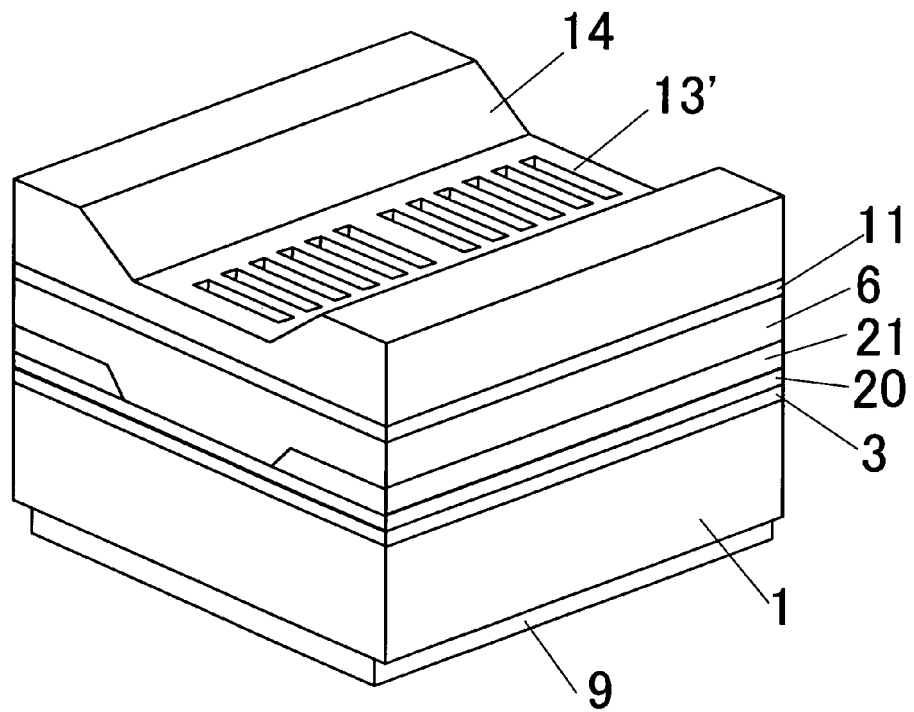
FIG. 16 is an illustrative perspective view for explaining a process of forming a diffraction grating in a manufacturing method of the semiconductor laser concerning the fifth embodiment of the present invention.

Namely, the diffraction grating pattern 13' is formed by applying the photoresist 14 to one half-finished product (device) manufactured as described above and by the exposure (for example, the interference exposure, the electron beam (EB) exposure or the like), as shown in FIG. 16.

Next, after having transcripted the diffraction grating pattern 13' onto the p-type doped GaInAs contact layer 11 and the p-type doped InP cladding layer 6 by dry etching, the resist 14 is removed (peeled off).

In this way, the semiconductor laser for evaluation (device) in which the diffraction grating 13 is formed is manufactured (refer to FIG. 14). Namely, the semiconductor laser for evaluation is manufactured by forming the diffraction grating 13 along the quantum well active layer 3 in the region having a predetermined width right above the quantum well active layer 3 so as to extend from the surface (namely, the surface at the crystal growth side of the semiconductor stacking body; the surface of the semiconductor crystal) of the p-type doped GaInAs contact layer 11 to the p-type doped InP cladding layer 6 of the half-finished product manufactures as described above (process of manufacturing the semiconductor laser for evaluation).

Next, with the same method as the above-described second embodiment, the period of the diffraction grating 13 is determined (process of determining the period of the diffraction grating).

Then, with the same method as the above-described second embodiment, the semiconductor laser having the desired oscillation wavelength is manufactured.

Namely, the diffraction grating 13 having the determined period is formed in the half-finished product manufactured as described above by the same process of the manufacturing process of the semiconductor laser for evaluation as described above (refer to FIG. 16). Namely, the diffraction grating 13 having the determined period is formed along the quantum well active layer 3 in the region having a predetermined width right above the quantum well active layer 3 so as to extend from the surface (namely, the surface at the crystal growth side of the semiconductor stacking body; the surface of the semiconductor crystal) of the p-type doped GaInAs contact layer 11 of the half-finished product to the p-type doped InP cladding layer 6. Thereby, the semiconductor laser having the desired oscillation wavelength is manufactured (process of manufacturing the semiconductor laser, process of manufacturing the finished product).

In addition, in the case where the diffraction grating 13 is formed only in the p-type doped GaInAs contact layer 11, the diffraction grating 13 may be formed so as to extend from the surface of the p-type doped GaInAs contact layer 11 of the half-finished product to the inside thereof by transferring the diffraction grating pattern 13' only onto the p-type doped GaInAs contact layer 11. Moreover, the diffraction grating 13 may be formed so as to extend from the surface of the p-type doped GaInAs contact layer 11 of the half-finished product to the p-type doped GaInAs guide and etch-stopping layer 20, or the n-type doped InP electric-current constriction layer 21 by transferring the diffraction grating pattern 13' onto the p-type doped GaInAs contact layer 11 and the p-type doped GaInAs guide and etch-stopping layer 20, or the n-type doped InP electric-current constriction layer 21.

Thus, in this embodiment, after having formed on the n-type doped InP substrate 1 the semiconductor stacking body which includes the quantum well active layer 3, the diffraction grating 13 is formed in the upper region of the quantum well active layer 3 so as to appear in the surface of the semiconductor stacking body.

Therefore, according to the semiconductor laser and the manufacturing method thereof concerning this embodiment, the same operation and effect as those of the above second embodiment are obtained.

In addition, while in this embodiment the diffraction grating 13 is formed so as to appear in the surface of the p-type doped GaInAS contact layer 11 like the above-described second embodiment, the present invention is not limited to this. For example, like the above-described first embodiment, as shown in FIG. 17, the diffraction grating 13 may be formed so as to appear in the surface of the p-type doped InP cladding layer 6 by removing a part of the p-type doped GaInAs contact layer 11.

Figure 17:
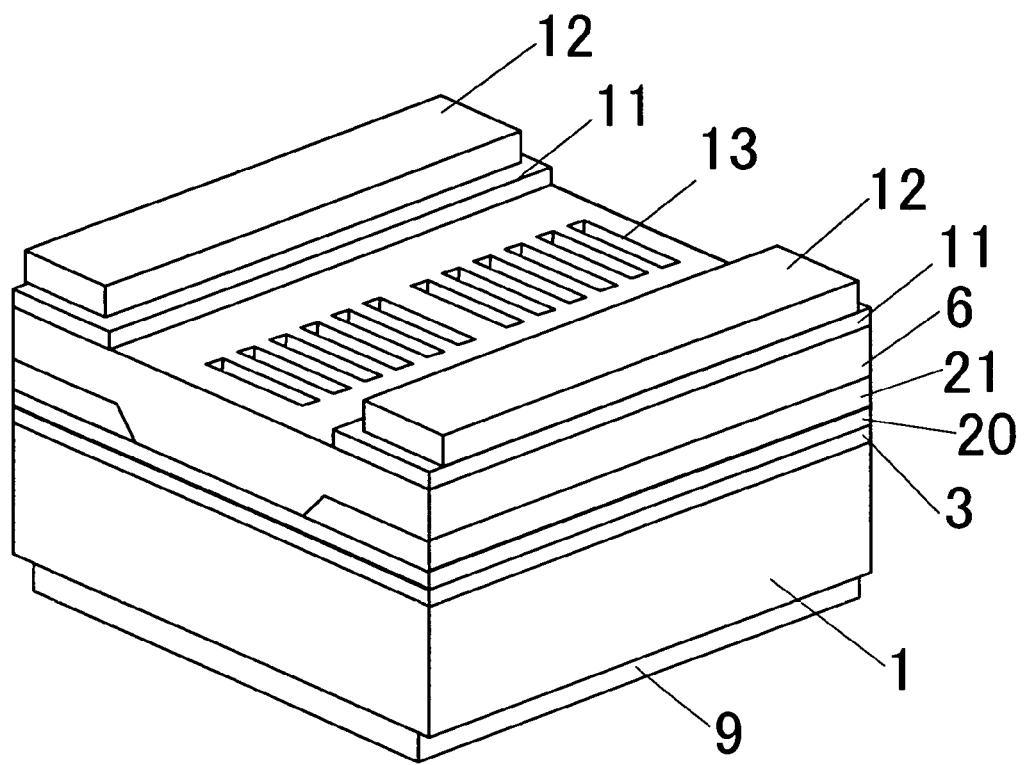
FIG. 17 is an illustrative perspective view showing a structure of a semiconductor laser concerning a modification of the fifth embodiment of the present invention.

Namely, like the above-described first embodiment, as shown in FIG. 17, by removing the p-type doped GaInAs contact layer 11 across a predetermined width (for example, a width of approximately 5 μm to approximately 50 μm level) in the upper region of the quantum well active layer 3, and by forming two belt-like p-type doped GaInAs contact layers 11 in parallel along the quantum well active layer 3 (in the optical axis direction of the laser), in the opposite sides of the region having a predetermined width (for example, a width of approximately 5 μm to 50 μm) in the direction perpendicular to the optical axis of the laser, the belt-like p-side electrodes 12 may be formed only on these p-type doped GaInAs contact layers 11, respectively.

In this case, as shown in FIG. 17, because the diffraction grating 13 is formed so as to appear in the surface of the p-type doped InP cladding layer 6, the p-type doped GaInAs contact layer 11 is formed in the region in which the diffraction grating 13 is not formed of the surface of the p-type doped InP cladding layer 6. Namely, the p-type doped GaInAs contact layer 11 is formed in parallel along the region (namely, the region having a predetermined width right above the quantum well active layer 3) in which the diffraction grating 13 is formed, in the opposite sides of the region in which the diffraction grating 13 is formed.

Other Embodiments

In addition, while the semiconductor laser (device) is configured as forming the layers made of a GaInAsP-type compound semiconductor material on the InP substrate in each of the embodiments describe above, the material for constituting the device is not limited to this, and any material capable of constituting the semiconductor laser may be used. Also in this case, the same effect as the one of each of the above-described embodiments is obtained. For example, each layer may be formed using a GaAlInAs-type compound semiconductor material. Moreover, for example, each layer may be formed employing a GaAs substrate and using a semiconductor material which can crystal-grow (epitaxial-grow, for example) on the GaAs substrate. Moreover, each layer may be formed employing a GaInNAs-type semiconductor material. Moreover, while the substrate having an n-type conductivity is used as the InP substrate in the above respective embodiments, a substrate having a p-type conductivity may be used. In this case, all the conductivities of the respective layers formed on the substrate become opposite.

Moreover, while the interference exposure or the electron beam (EB) exposure is used to form the diffraction grating 13 in the above respective embodiments, the present invention is not limited to this. For example, the diffraction grating 13 may be formed directly into the semiconductor layer by a focused ion beam.

Moreover, while the diffraction grating 13 is formed after having formed the p-side electrode 12 in the above respective embodiments, the sequence of these processes is not limited to this. For example, in the case where the equivalent refractive index is identified by calculation by examining the cross-sectional shape of apart of the wafer to examine the width of the active-layer, it is not necessary to form the p-side electrode 12 in advance. Therefore, the diffraction grating 13 may be formed in advance and then the p-side electrode 12 may be formed. In addition, the n-side electrode 9 may be formed after having formed the p-side electrode 12 or the diffraction grating 13, or may be formed in advance before forming these.

Moreover, while the DFB laser as an example has been explained in the above respective embodiments, the present invention can be applied to the DBR laser, as well.

Figure 18:
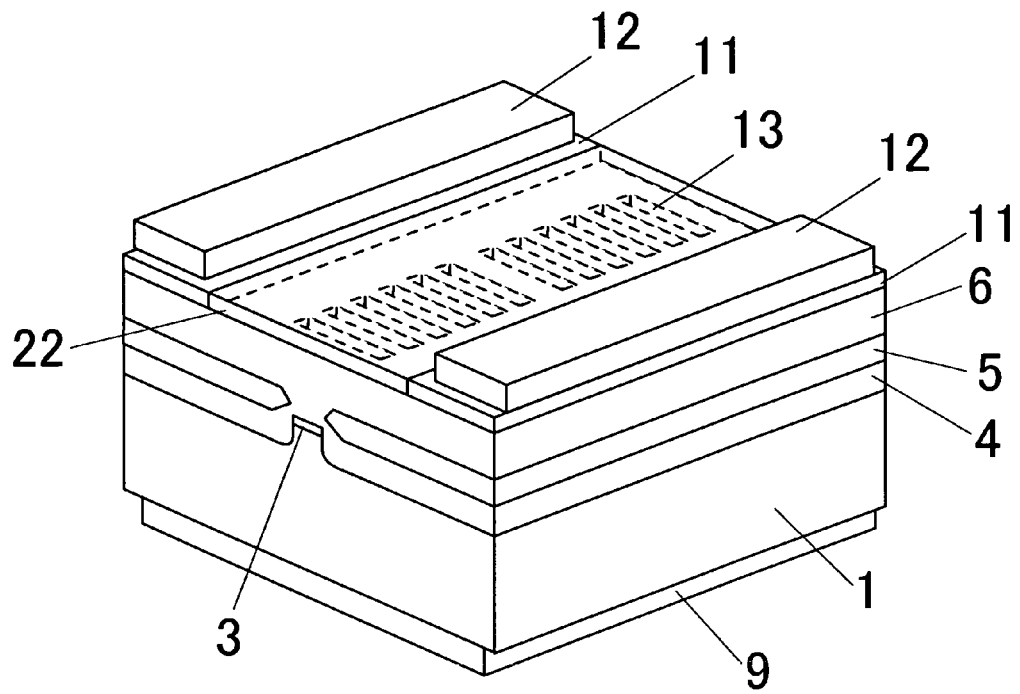
FIG. 18 is an illustrative perspective view showing a structure of a semiconductor laser concerning a modification of the first embodiment of the present invention.
Figure 19:
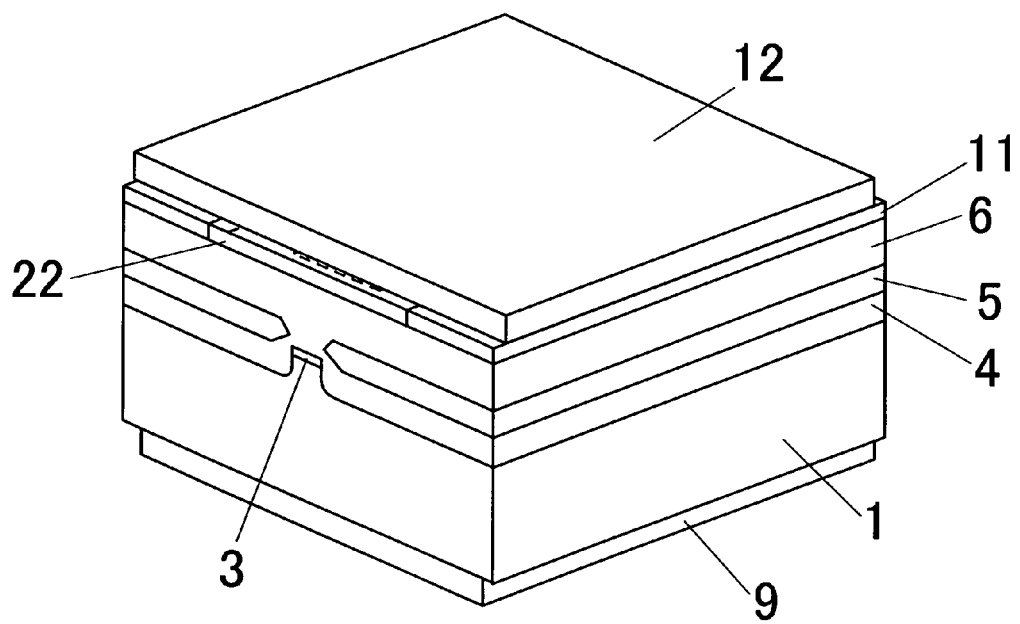
FIG. 19 is an illustrative perspective view showing a structure of a semiconductor laser concerning another modification of the first embodiment of the present invention.

Moreover, while the diffraction grating 13 which appears in the surface of the semiconductor stacking body is being exposed in the above respective embodiments, the region in which the diffraction grating 13 is formed of the surface of the semiconductor stacking body may be coated to protect with a dielectric film (a passivation film, a protective film) 22 made of a dielectric material, such as $SiO_2$ and BCB, for example, as shown in FIG. 18. In this case, the diffraction grating 13 may be buried with the dielectric material. Furthermore, as shown in FIG. 19, the p-side electrode 12 may be formed so as to cover the whole surface of the contact layer 11 and the dielectric film 22. Namely, when forming the p-side electrode 12 on the contact layer 11, the metal deposited on the surface of the dielectric film 22 may be left as it is. Moreover, a part of the dielectric film 22 may be interposed between the contact layer 11 and the p-side electrode 12 in so far as the conduction of the electric current is not impeded.

Moreover, the region in which the diffraction grating 13 is formed of the surface of the semiconductor stacking body may be coated to protect with a metal film made of metallic materials, such as the electrode material. In this case, the diffraction grating 13 may be buried with the metallic material (the metal film). Namely, the present invention can be applied to a lossy coupling type DFB laser.

Moreover, the grooves of the diffraction grating 13 may be buried with a semiconductor material.

Furthermore, while the diffraction grating 13 is formed in the region right above the active layer 3 (in the upper region of the active layer 3) in the above respective embodiments, the present invention is not limited to this. The diffraction grating 13 may be formed in parallel with the region (assuming, this region is also included in the upper region of the active layer 3) located on the opposite sides of the region right above the active layer 3, respectively.

Figure 20:
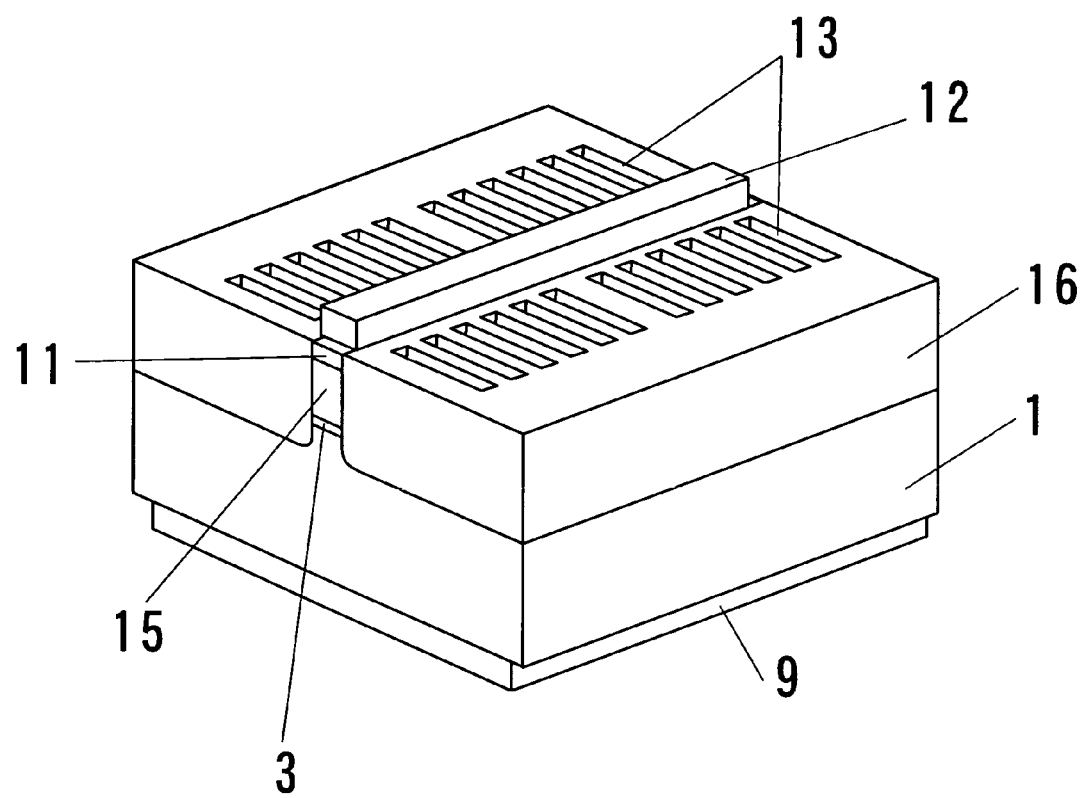
FIG. 20 is an illustrative perspective view showing a structure of a semiconductor laser concerning a modification of the third embodiment of the present invention.
Figure 21:
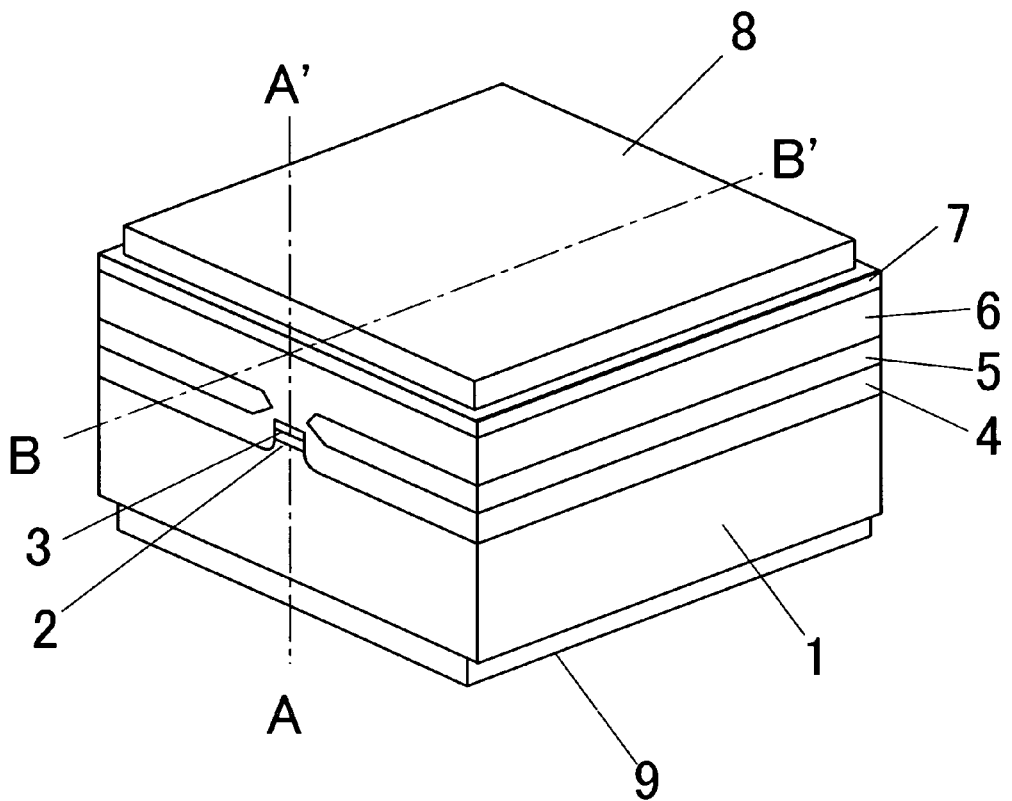
FIG. 21 is an illustrative perspective view showing a structure of a conventional DFB laser.
Figure 22:
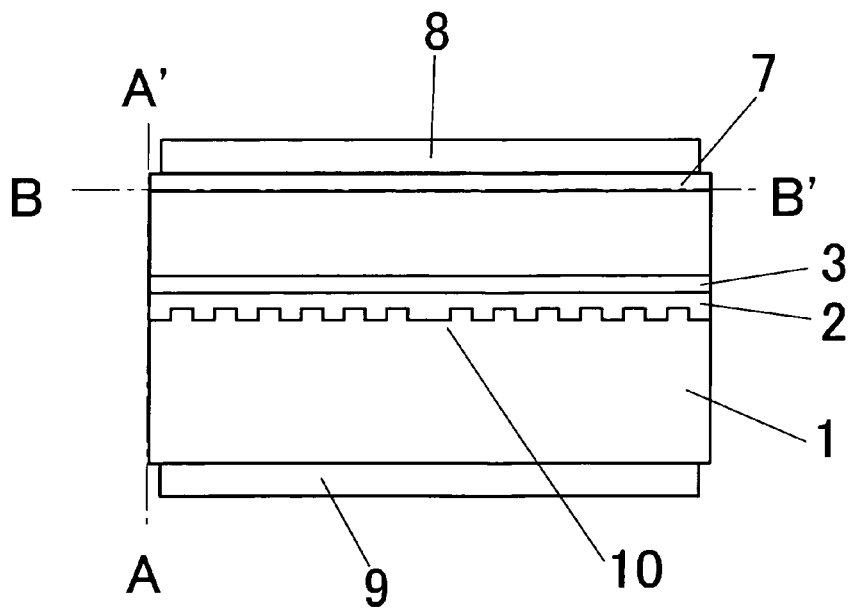
FIG. 22 is an illustrative cross sectional view showing a structure of the conventional DFB laser, and is a cross sectional view along the alternate long and short dash line shown by A-A', and the alternate long and short dash line shown by B-B' of FIG. 21.

For example, in the semiconductor laser concerning the third embodiment as described above, as shown in FIG. 20, while forming the contact layer 11 only in the region right above the cladding layer 15 formed on the active layer 3 and forming the p-side electrode 12 on this contact layer 11, the diffraction grating 13 may be formed in parallel along the active layer 3 in the regions located on the opposite sides of the region right above the active layer 3, respectively, without forming in the region right above the active layer 3. Namely, the diffraction grating 13 may be formed on the electric-current constriction layer 16 without being formed on the contact layer 11. In this case, the diffraction grating 13 is preferably formed symmetrically with respect to the parallel line to the center line (the optical axis of the laser) of the active layer 3. In addition, in the structure in which the cladding layer of the upper potion is formed across the whole surface like the semiconductor laser concerning the first embodiment, the electrodes do not have to be provided in the region right above the active layer 3, but may be provided in the regions outside the diffraction grating 13, respectively. For this reason, the freedom of the arrangement of the electrodes will be increased.

In addition, the present invention is not limited to the structures in the above respective embodiments or in the other sections, and various modifications can be made within the scope not departing from the substance of the present invention.

What is claimed is:

1. A semiconductor laser comprising:
a semiconductor substrate;
a semiconductor stacking body including a waveguide core formed on said semiconductor substrate, a cladding layer formed above said waveguide core, and a contact layer;
a diffraction grating with a period determining an oscillation wavelength and formed in a manner that does not impart a change in oscillation direction to an output wavelength; and
an electrode;
wherein said diffraction grating is formed along said waveguide core so as to appear in the surface of said cladding layer,
said contact layer is formed along said waveguide core on a region other than a region where said diffraction grating appears in the surface of said cladding layer,
each of a period direction of said diffraction grating and a longitudinal direction of said contact layer is in parallel in a longitudinal direction of said waveguide core,
said electrode is provided on said contact layer, and
said diffraction grating is formed right above a current injection region of said waveguide core, the current injection region being a region where current injection is performed through said electrode to amplify light.

2. The semiconductor laser according to claim 1, wherein said semiconductor laser is configured as a buried type semiconductor laser which comprises an electric-current constriction structure.

3. The semiconductor laser according to claim 2, wherein said electric-current constriction structure is a pnpn thyristor structure.

4. The semiconductor laser according to claim 2, further comprises a semi-insulating planar buried hetero-structure, wherein said electric-current constriction structure includes a semi-insulating semiconductor layer.

5. The semiconductor laser according to claim 2, further comprises a semi-insulating buried hetero-structure, wherein said electric-current constriction structure is constituted of a semi-insulating semiconductor layer.

6. The semiconductor laser according to claim 1, wherein said semiconductor laser is configured as an inner stripe type semiconductor laser which comprises an electric-current constriction structure.

7. A semiconductor laser comprising:
a semiconductor substrate;
a semiconductor stacking body including a waveguide core formed on said semiconductor substrate and a contact layer formed above said waveguide core;
a diffraction grating with a period determining an oscillation wavelength and formed in a manner that does not impart a change in oscillation direction to an output wavelength; and
an electrode;
wherein said diffraction grating is formed along said waveguide core so as to appear in the surface of said contact layer,
said electrode is formed along said waveguide core on a region other than a region where said diffraction grating appears in the surface of said contact layer,
each of a period direction of said diffraction gating and a longitudinal direction of said electrode is in parallel in a longitudinal direction of said waveguide core, and
said diffraction grating is formed right above a current injection region of said waveguide core, the current injection region being a region where current injection is performed through said electrode to amplify light.

8. The semiconductor laser according to claim 1, further comprises a protection film covering the region in which said diffraction grating is formed.

9. The semiconductor laser according to claim 8, wherein said protection film is a dielectric film.

10. The semiconductor laser according to claim 1, further comprises a dielectric film covering the region in which said diffraction grating is formed, wherein said dielectric film is formed so that a part thereof is interposed between said contact layer and said electrode.

11. The semiconductor laser according to claim 8, wherein a metal is deposited on the surface of said protection film.

12. The semiconductor laser according to claim 1, further comprises a metal film covering the region in which said diffraction grating is formed.

13. The semiconductor laser according to claim 1, wherein each of said diffraction grating and said electrode is formed in parallel along said waveguide core.

* * * * *